United States Patent
Yoshitake et al.

(10) Patent No.: US 7,643,130 B2
(45) Date of Patent: *Jan. 5, 2010

(54) POSITION MEASURING APPARATUS AND POSITIONAL DEVIATION MEASURING METHOD

(75) Inventors: Shusuke Yoshitake, Kanagawa (JP); Shuichi Tamamushi, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 394 days.

This patent is subject to a terminal disclaimer.

(21) Appl. No.: 11/555,397

(22) Filed: Nov. 1, 2006

(65) Prior Publication Data

US 2007/0103657 A1    May 10, 2007

(30) Foreign Application Priority Data

Nov. 4, 2005    (JP) ............................... 2005-320299

(51) Int. Cl.
G03B 27/62    (2006.01)
(52) U.S. Cl. ............................... 355/75; 355/53; 355/76; 355/77; 250/492.22; 250/492.3
(58) Field of Classification Search ............... 355/52, 355/75–77, 30, 53; 250/492.22, 492.3, 492.1, 250/492.2; 356/399–401, 237.4, 237.5, 509, 356/601; 430/5, 22, 311
See application file for complete search history.

(56) References Cited

U.S. PATENT DOCUMENTS

| 4,391,511 A | * | 7/1983 | Akiyama et al. | ............... | 355/40 |
| 4,924,258 A | * | 5/1990 | Tsutsui | .................. | 355/53 |
| 5,191,218 A | * | 3/1993 | Mori et al. | ............. | 250/453.11 |
| 5,418,092 A | * | 5/1995 | Okamoto | .................. | 430/5 |
| 5,564,682 A | * | 10/1996 | Tsuji | .......................... | 269/21 |

(Continued)

FOREIGN PATENT DOCUMENTS

JP    9-61150    3/1997

(Continued)

OTHER PUBLICATIONS

U.S. Appl. No. 11/555,478, filed Nov. 1, 2006, Yoshitake et al.

(Continued)

*Primary Examiner*—Peter B Kim
*Assistant Examiner*—Christina Riddle
(74) *Attorney, Agent, or Firm*—Oblon, Spivak, McClelland, Maier & Neustadt, L.L.P.

(57) ABSTRACT

A position measuring apparatus includes a holder having storage spaces in which a three-point support member for supporting a backside of a substrate being a mask at three points, and a vacuum chuck member for holding a backside of a substrate being a mask are prepared, a stage on which one of the three-point support member and the vacuum chuck member prepared in the storage spaces of the holder is mounted, a vacuum pump to hold and chuck the substrate through the vacuum chuck member in a state of being mounted on the stage, and a recognition unit to recognize a position of a pattern written on the substrate supported by the three-point support member mounted on the stage and a position of a pattern written on the substrate held by the vacuum chuck member on the stage.

20 Claims, 20 Drawing Sheets

U.S. PATENT DOCUMENTS

| | | | |
|---|---|---|---|
| 5,847,813 A * | 12/1998 | Hirayanagi | 355/75 |
| 6,032,997 A * | 3/2000 | Elliott et al. | 294/64.1 |
| 6,123,502 A * | 9/2000 | Adams et al. | 414/752.1 |
| 6,366,342 B2 * | 4/2002 | Tanaka | 355/75 |
| 6,464,790 B1 * | 10/2002 | Sherstinsky et al. | 118/715 |
| 6,897,940 B2 * | 5/2005 | Sogard | 355/55 |
| 2002/0037625 A1 * | 3/2002 | Kyoh et al. | 430/5 |
| 2003/0016338 A1 * | 1/2003 | Yasuda et al. | 355/55 |
| 2003/0148635 A1 * | 8/2003 | Hasegawa et al. | 430/311 |
| 2004/0070740 A1 * | 4/2004 | Irie | 355/52 |
| 2004/0223132 A1 * | 11/2004 | Nishi et al. | 355/75 |
| 2005/0128462 A1 * | 6/2005 | Matsui | 355/72 |
| 2007/0103659 A1 * | 5/2007 | Yoshitake et al. | 355/53 |

FOREIGN PATENT DOCUMENTS

| | | |
|---|---|---|
| JP | 2004-214415 | 7/2004 |
| JP | 2004-235221 | 8/2004 |

OTHER PUBLICATIONS

SEMI P37-1102, "Specification For Extreme Ultraviolet Lithography Mask Substrates", Semiconductor Equipment and Materials International, pp. 1-10, 2001, 2002.

SEMI P38-1103, "Specification For Absorbing Film Stacks And Multilayers On Extreme Ultraviolet Lithography Mask Blanks", Semiconductor Equipment and Materials International, pp. 1-9, 2002, 2003.

SEMI P40-1103, "Specification For Mounting Requirements And Alignment Reference Locations For Extreme Ultraviolet Lithography Masks", Semiconductor Equipment and Materials International, pp. 1-6, 2003.

* cited by examiner

210 { 212 : Upper reference block
214 : Clamp pin

POSITION MEASURING APPARATUS AND POSITIONAL DEVIATION MEASURING METHOD

CROSS-REFERENCE TO RELATED APPLICATION

This application is based upon and claims the benefit of priority from the prior Japanese Patent Application No. 2005-320299 filed on Nov. 4, 2005 in Japan, the entire contents of which are incorporated herein by reference.

BACKGROUND OF THE INVENTION

1. Field of the Invention

The present invention relates to a position measuring apparatus and a positional deviation measuring method and, more particularly, to an apparatus and a method for measuring a pattern positional deviation of EUV (Extreme Ultra Violet) masks written or "drawn" by using variably-shaped electron beams, for example.

2. Related Art

In recent years, circuit line widths of semiconductors are becoming narrower and narrower with an increase in pattern density. In order to precisely make large scale integrated circuits on a silicon (Si) wafer, exposure technique of transferring an original written on a mask (also called a master or "original" pattern or a reticle) is progressing. For example, technique of optical proximity effect correction of arranging sub-resolution assistant features, which are not to be printed, around an original mask pattern is developed. Alternatively, off-axis illumination technique of giving anisotropy to lights used for printing in order to partially increase resolution is developed. In addition, liquid immersion exposure technique of filling liquid, such as water or special oil having a refraction index larger than that of air, between an objective lens and a wafer to increase a resolution limit is also developed.

By virtue of these techniques, a pattern equal to or less than 90 nm, which is half of 193 nm being a wavelength of an exposure light source, is becoming producible. Particularly, in the liquid immersion exposure technique, it is shown that a pattern of 45 nm can also be printed based on a theoretical refraction index of water. Therefore, it is thought if still more ideal oil is found, a pattern of near 32 nm can be printable by utilizing the liquid immersion technique.

However, in such exposure technique, it is assumed that sub-resolution assistant features for correcting an optical proximity effect may become complicated. Although sub-resolution assistant features are patterned on a mask and not printed onto a wafer, it has an influence when an transferring image is printed on the wafer. The sub-resolution assistant features become complicated in proportion as the influence of an aerial image becomes large. Moreover, the complicated pattern has a large influence on writing time of an original mask. Furthermore, there is also a very big problem concerning the way to inspect sub-resolution assistant features on a mask.

In order to solve those problems mentioned above, shortening wavelength itself of an exposing light is also considered similar to the prior improvement techniques of lithography. Developing new lithography technique with a light of 157 nm has been given up due to lack of lens material for the optics used for image shrinking and transferring. For this reason, it is developed that the extreme ultraviolet (EUV) light with a wavelength of 13.4 nm becomes most promising at present. As to the EUV light, which is classified into a soft-X-ray area, it cannot make a projection optics any longer because it is penetrated/absorbed by all materials being discovered. Therefore, a catadioptric optics is proposed for the exposure system using the EUV light.

Concerning a technique to hold EUV masks, a method of chucking almost all the backside in a planar state is proposed instead of a conventional method of holding the circumference by three or four points in order to let transmitted lights pass. Furthermore, since the holding system itself of EUV mask is installed in a vacuum chamber in order to prevent attenuation of EUV light, it is premised on use of an electrostatic chuck, in order to hold a mask for EUV, called an EUV mask hereinafter. Guidelines for substrates to be exposed and electrostatic chucks themselves are severely defined as they are specified in the SEMI standard. Refer to, for example, "SEMI P38-1103 SPECIFICATION FOR ABSORBING FILM STACKS AND MULTILAYERS ON EXTREME ULTRAVIOLET LITHOGRAPHY MASK BLANKS", "SEMI P37-1102 SPECIFICATION FOR EXTREME ULTRAVIOLET LITHOGRAPHY MASK SUBSTRATES", or "SEMI P40-1103 SPECIFICATION FOR MOUNTING REQUIREMENTS AND ALIGNMENT REFERENCE LOCATIONS FOR EXTREME ULTRAVIOLET LITHOGRAPHY MASKS."

Moreover, when fabricating a master EUV mask, it is difficult to predict total deformations of a substrate in the step of forming a reflective film, or in the process of patterning. Therefore, according to the above SEMI P40-1103, holding a substrate by an electrostatic chuck is essential for pattern writing apparatuses, position measuring apparatuses, and exposure apparatuses FIG. 24 shows a schematic diagram for explaining operations of a conventional variable-shaped electron beam pattern writing apparatus. As shown in the figure, the variable-shaped electron beam pattern writing apparatus (EB (Electron Beam) writing apparatus) includes two aperture plates A first or "upper" aperture plate 410 has an opening or "hole" 411 in the shape of rectangle, for example, for shaping an electron beam 330. This shape of the rectangular opening may also be a square, a rhombus, a rhomboid, etc. A second or "lower" aperture plate 420 has a special shape of opening 421 for shaping the electron beam 330 having passed through the opening 411 of the first aperture plate 410 into a desired rectangular. The electron beam 330 that left a charged particle source 430 and has passed through the opening 411 of the first aperture plate 410 is deflected by a deflector. Then, the electron beam 330 passes through part of the special shape of opening 421 of the second aperture plate 420, and reaches a target workpiece 340 mounted on a stage which is continuously moving in one predetermined direction (e.g. X-axis direction). In other words, a rectangular shape capable of passing through both the opening 411 and the special shape of opening 421 is used for pattern writing of the target workpiece 340 mounted on the stage. This method of writing or "forming" a given variable shape by letting beams pass through both the opening 411 and the special shape of opening 421 is called the "variable shaping."

It is also very difficult to meet the guidelines of electrostatic chucks with precision and accuracy, described in the SEMI standard (SEMI P40-1103), and furthermore to check the chucks being met the specifications. Moreover, according to ITRS roadmap, the particle diameter of a particle permitted in the process of EUV mask making is 30 nm and/or less. As to the backside of an EUV mask, a conductive film, such as Cr having sufficient adhesion to glass, is coated on the backside for an electrostatic chuck. In the case of employing the method of the electrostatic chuck, etc. in which the area of the surface contacting with a mask is large, there is much possibility of the electric conduction film on the backside being damaged by friction etc. generated at a contact part and such damaged film becoming a particle. Moreover, if a particle exists on the backside of an EUV mask, there is concern to fail to meet the requirements of image positional accuracy of the pattern because of a local deformation of the EUV mask caused by the mask backside not having a tight contact in and around the particle. Therefore, it is necessary to always retain the chuck surface to be clean. However, to retain and manage the chuck surface to be such clean is very difficult.

Furthermore, since a mask is generally used as a master in the exposure apparatus so that images can be shrunk and transferred one by one onto a wafer, only the mask which has passed a final cleaning process is used. However, in case of making an EUV mask with the pattern writing apparatus, it is necessary to use the EUV substrate with resist which being a photosensitizing polymer is applied similar to the case of writing a pattern on an optical mask. As the optical mask described herein, the one used in an exposure process by utilizing lights other than EUV lights, for example, ultraviolet rays is mentioned. Similarly to the ordinary optical mask, the resist applied on the EUV mask acts as a photosensitizing polymer and causes a chemical reaction to the intended pattern written with electron beams. As a result of this, only the part which has changed in quality by the irradiation of the electron beams on the pattern is eliminated (positive type resist) or a part other than the irradiated part on the pattern is eliminated (negative type resist) in a next development process in order to obtain a resist pattern. Then, using the resist as a protective film, chromium (layer under the resist layer) is removed by etching in the case of an ordinary optical mask, or metal of chromium family or tantalum family being a shading film is removed by etching in the case of an EUV mask. Consequently, a mask which lets lights pass through only the removed part can be obtained. Then, the resist left as a protective film of etching is removed by chemically resist stripping processing.

Regarding this resist, it needs to be applied thinly and uniformly whether it is in the optical mask case or the EUV mask case. Generally, resist is composed of a polymer film whose main component is carbon, and is applied by a spin coating technique which trickles the resist, melted in solvent, of a predetermined amount on a spinning substrate. Although there is a possibility of the resist partially going around to the side and the backside of the substrate at the time of the application, it is very difficult to remove the residues and adhesive substances, such as resist, on the side or the backside without any influence on the resist of the mask surface. In addition, after the resist is coated, baking (prebaking) is performed at a predetermined temperature for mainly stabilizing and equalizing sensitivity based on the kind and conditions of the resist.

However, even when the baking process is performed, the resist being a polymer film has a feature of easily damaged and removed. When it is necessary to load a substrate or hold a substrate during writing in the pattern writing apparatus, only limited areas are touched to handle and hold in order to avoid any contact to the inside of limited areas on the mask surface. In this situation, it is easily considered that the resist which unexpectedly goes around to the side or the backside may become a cause of particulate contamination in the pattern writing apparatus because such resist removes or attaches to a contact portion.

Furthermore, when an electrostatic chuck is used for the EUV mask, since almost all the backside of the mask contacts with the chuck, it is much expected that adhesive substances remaining on the side or backside, such as resist, are removed to become particles, and consequently they are attracted by the chucking surface of electrostatic chuck. Therefore, it becomes difficult to retain the chuck surface in a clean condition. As a result, since the particles on the electrostatic chuck surface are contacted with the mask backside, keeping the mask backside to be an ideal plane becomes difficult.

Then, another method of writing a pattern is proposed in which the backside shape of a substrate being a mask is measured during writing or before writing, in a state of the substrate being held without using the electrostatic chuck, and a positional deviation of the pattern is calculated and corrected based on the measured backside shape of the substrate. (See JP-A-2004-214415, for example.

However, according to the technique disclosed in JP-A-2004-214415, height position distribution of the substrate backside, being opposite to the surface on which a pattern is written, is measured. Then, because of employing this method, it comes under the influence due to the gravitational sag at the time of measuring the substrate backside, and there is a possibility that a amount of the gravitational sag for each substrate may change depending upon a tolerance of the substrate thickness or a deformation amount may change, in each substrate, with the change of multilayer film stress peculiar to EUV masks. Therefore, a problem may arise in the reproducibility when reproducing, by calculation, a state of the substrate backside being corrected to be a desired curved or flat surface. As to a measuring device of height distribution, there is a measuring instrument utilizing an interferometer generally used to measure flatness of EUV masks. However, it is very difficult to equip this measuring instrument on the pattern writing apparatus because of structure restrictions of the apparatus. Accordingly, even if there is a measuring instrument which can be equipped on the pattern writing apparatus in consideration of the structure restrictions, there is concern that resolution of the measuring device may not enough.

Further, even if the pattern writing apparatus can perform writing, a problem occurs in a position measuring apparatus which measures a position of a written pattern. That is, since the mask to be measured by the position measuring apparatus is a substrate prior to the step of the final cleaning process, residues, such as resist, and particles adhered during processes may remain. If such EUV mask is held by the electrostatic chuck, particles on the substrate will be attracted by the electrostatic chuck. Therefore, it becomes difficult to retain the chuck surface in a clean state. Moreover, since highly precise measurement is required, the current position measuring apparatus needs to be installed in a homoiothermal chamber in which temperature and humidity are controlled in order to make environmental change small. Since there is no necessity of operating the position measuring apparatus in a vacuum at the time of pattern position measurement, it is desirable to use it in the atmosphere where handling and management of the apparatus is easily performed. However, if the electrostatic chuck is used in the atmosphere, there is a great risk of attracting positive-charged substances in the environment by the static electricity. Consequently, since particles enter between the electrostatic chuck surface and the mask backside, keeping the mask backside to be an ideal flat surface becomes difficult. Thus, there is a possibility that highly precise position measurement cannot be obtained.

As mentioned above, there is a problem that when using an electrostatic chuck for holding an EUV mask in the position measuring apparatus, making the electrostatic chuck which fulfills specifications in the guidelines advocated by SEMI is very difficult. Moreover, even if it becomes possible to use the electrostatic chuck which fulfills the specifications, there is a problem, such as a particle management, in the position measuring apparatus. In addition, even if it becomes possible to use the electrostatic chuck which fulfills the specifications, there is a problem stated below. That is, with respect to a pattern written by data correction without using the electrostatic chuck, it is impossible for the position measuring apparatus using the electrostatic chuck to evaluate image placement accuracy of the pattern writing apparatus that has written such pattern.

BRIEF SUMMARY OF THE INVENTION

It is an object of the present invention to solve the problems mentioned above and to provide a method and an apparatus of highly accurately measuring a pattern positional deviation of a written mask.

In accordance with one aspect of the present invention, a position measuring apparatus includes a holder having storage spaces in which a three-point support member for supporting a backside of a substrate being a mask at three points, and a vacuum chuck member for holding a backside of a substrate being a mask are prepared, a stage on which one of the three-point support member and the vacuum chuck member prepared in the storage spaces of the holder is mounted, a vacuum pump to hold and chuck the substrate through the vacuum chuck member in a state of being mounted on the stage, and a recognition unit to recognize a position of a pattern written on the substrate supported by the three-point support member mounted on the stage and a position of a pattern written on the substrate held by the vacuum chuck member on the stage.

In accordance with another aspect of the present invention, a positional deviation measuring method includes measuring a positional deviation to evaluate a pattern written on an EUV mask is printed onto a wafer, with selectively using a vacuum chuck, and measuring a positional deviation of a pattern written for managing conditions of a pattern writing apparatus which writes an EUV mask, with selectively using a three-point support.

In accordance with another aspect of the present invention, a positional deviation measuring method includes measuring, in a state of a backside of a substrate being held by a vacuum chuck, a positional deviation of a primary pattern that is written with a predicted positional deviation of a pattern written on a front-side surface of the substrate in the case of the backside surface of the substrate being corrected to be flat by measurement data of the backside topography of the substrate without influence of gravity sag, and measuring, in a state of the backside of the substrate being supported at three points, a positional deviation of a secondary pattern that is written with a predicted positional deviation of a pattern written on the front-side surface of the substrate in the case of the backside surface of the substrate being not corrected to be flat.

In accordance with another aspect of the present invention, a positional deviation measuring method includes measuring, in a state of a backside of a substrate being held by a vacuum chuck, a positional deviation of a first pattern that is written after a predicted positional deviation of a pattern written on a frontside of the substrate is corrected in the case of the backside of the substrate being corrected to be flat based on a topography of the backside of the substrate being set on its edge due to minimize the deformation by gravity, and measuring, in a state of the backside of the substrate being supported at three points, a positional deviation of a second pattern that is written after a predicted positional deviation of a pattern written on the frontside of the substrate is corrected in the case of the backside of the substrate being not corrected to be flat.

DETAILED DESCRIPTION OF THE INVENTION

In the following Embodiments, structures utilizing an electron beam as an example of a charged particle beam will be described. The charged particle beam is not restricted to the electron beam, and may the one using a charged particle, such as an ion beam.

Embodiment 1

Figure 1:
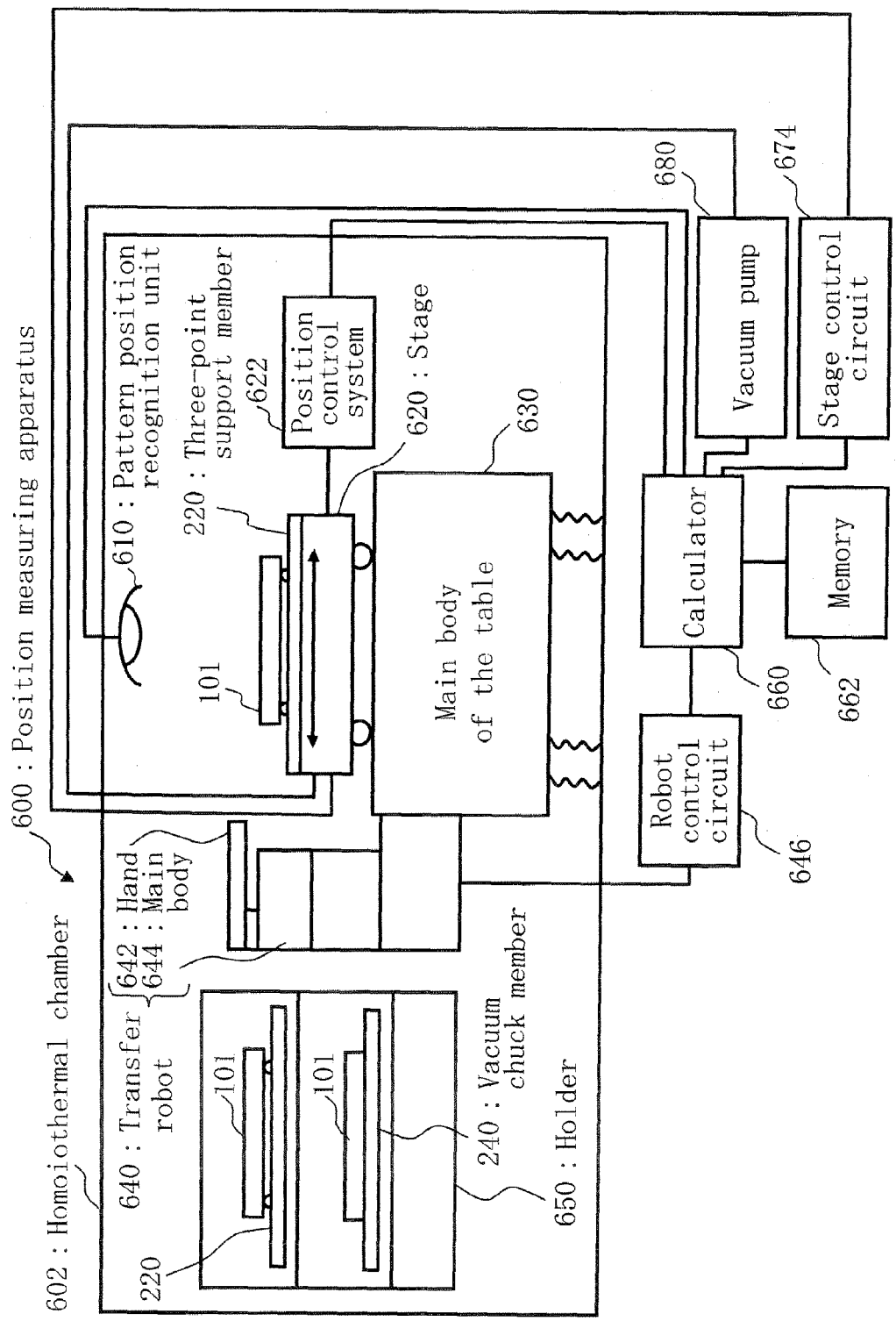
FIG. 1 is a schematic diagram showing a structure of a position measuring apparatus described in Embodiment 1.

FIG. 1 is a schematic diagram showing a structure of a position measuring apparatus described in Embodiment 1. As shown in the figure, a position measuring apparatus 600 includes a homoiothermal chamber 602, a pattern position recognition unit 610, a stage 620, a position control system 622, a main body of the table base 630, a transfer robot 640, a holder 650 having storage spaces, a robot control circuit 646, a calculator 660, a memory 662, a vacuum pump 680, and a stage control circuit 674. In the homoiothermal chamber 602, the pattern position recognition unit 610, such as a CCD camera, the stage 620, the position control system 622, the main body of the table base 630, the transfer robot 640, and the holder 650 is stored. The robot control circuit 646, the memory 662, the vacuum pump 680, and the stage control circuit 674 are connected to the calculator 660 to be controlled by it.

The inside of the homoiothermal chamber 602 is controlled to have a constant temperature, and main body of the table base 630 has a vibration isolation function. Storage spaces are prepared in the holder 650. In storage spaces being prepared in the holder 650, the first set composed of a three-point support member 220 and a target workpiece 101 laid or "supported" on the three-point support member 220, or the second set composed of a vacuum chuck member 240 and the target workpiece 101 laid or "placed" on the vacuum chuck member 240 is arranged. Moreover, the transfer robot 640 includes a hand 642 and a main body 644. Using the hand 642, the transfer robot 640 controlled by the robot control circuit 646 takes out the first set or the second set from the holder 650, and load it onto the stage 620. Moreover, using the hand 642, the transfer robot 640 takes the first set or the second set from the stage 620, and stores it in the holder 650.

Components required for explaining Embodiment 1 are described in FIG. 1. In addition, other structure elements usually required for the position measuring apparatus 600 may also be contained.

Figure 2:
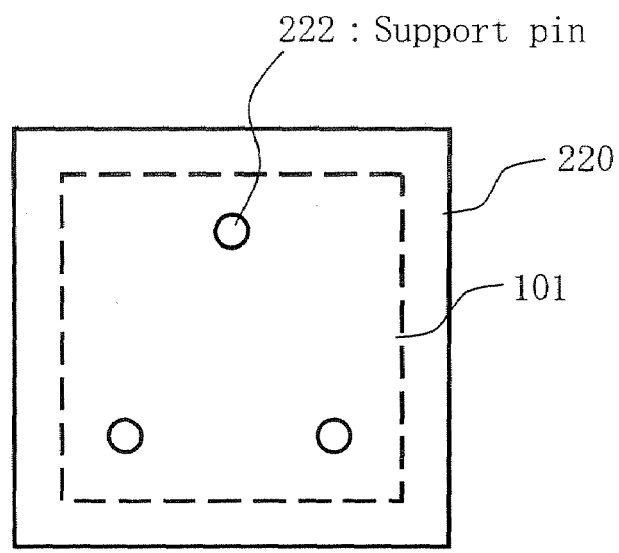
FIG. 2 is a schematic diagram showing an example of a structure of a three-point support member described in Embodiment 1.

FIG. 2 is a schematic diagram showing an example of a structure of the three-point support member described in Embodiment 1. As shown in the figure, three support pins 222 are arranged in the three-point support member 220. The backside of the target workpiece 101 is supported by these three support pins 222. It is suitable for the support pin 222 to be composed of hard material, such as ruby and sapphire. Deformation of the support pin 222 at the time of laying the target workpiece 101 can be suppressed by using hard material to compose the support pin. Consequently, errors can be reduced and excellent reproducibility can be obtained.

Figure 3:
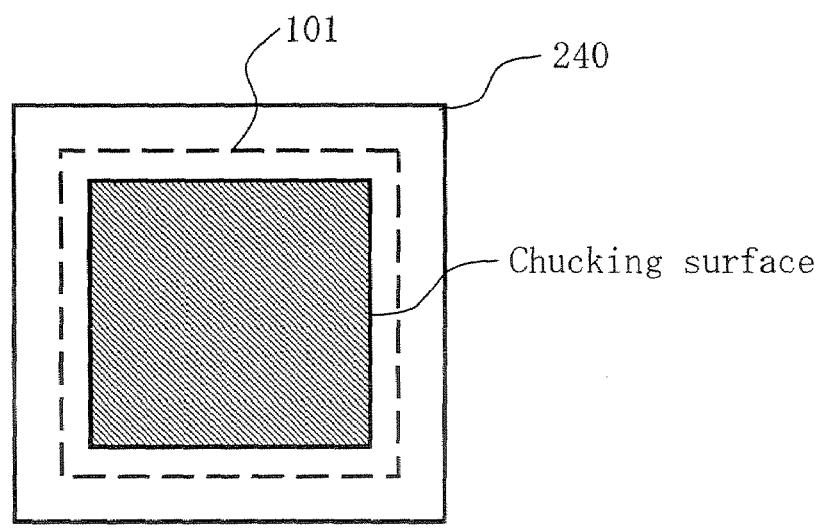
FIG. 3 is a schematic diagram showing an example of a structure of a vacuum chuck member described in Embodiment 1.

FIG. 3 is a schematic diagram showing an example of a structure of the vacuum chuck member described in Embodiment 1. As shown in the figure, an chucking surface is formed on the vacuum chuck member 240 so that the whole surface of the backside of the target workpiece 101, except the outer part of it, can be chucked to the surface. Specifications for the chucking surface are defined to be corresponding to the electrostatic chuck specified in the SEMI standard mentioned above. That is, the area and the shape of the chucking surface of the vacuum chuck member 240 are formed in accordance with the area and the shape of an chucking surface of an electrostatic chuck member.

Figure 4:
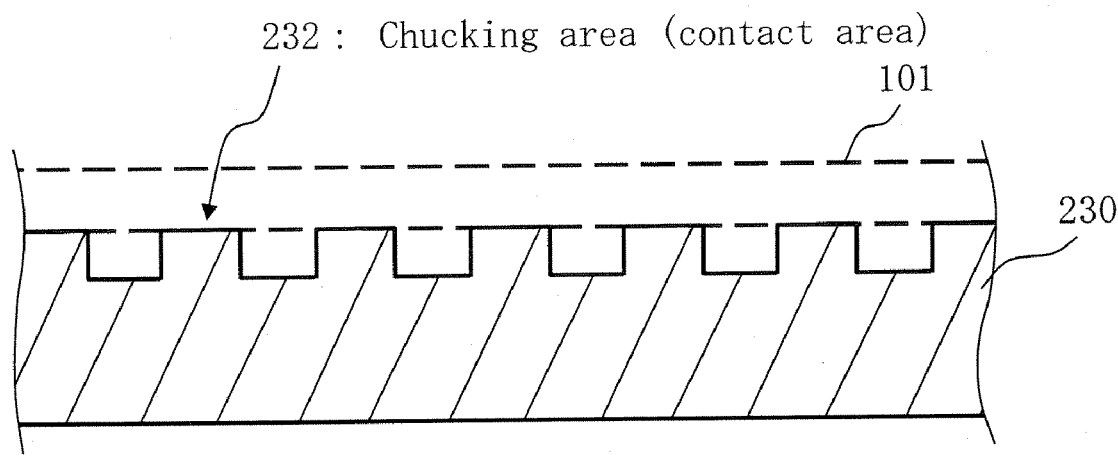
FIG. 4 is a schematic diagram showing an example of a section of an electrostatic chuck described in Embodiment 1.
Figure 5:
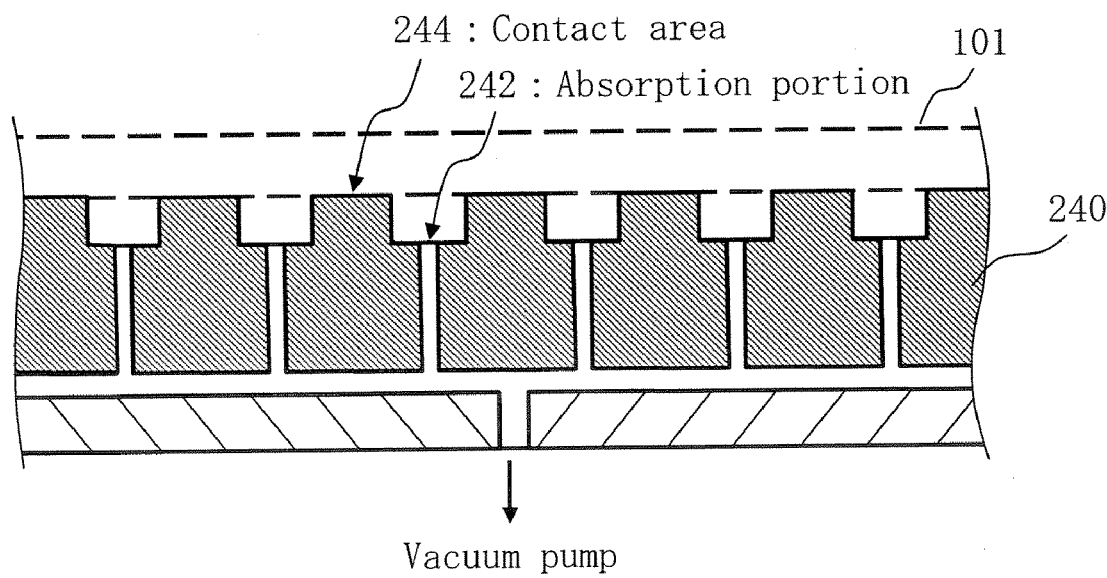
FIG. 5 is a schematic diagram showing an example of a section of a vacuum chuck described in Embodiment 1.

FIG. 4 is a schematic diagram showing an example of a section of an electrostatic chuck described in Embodiment 1. FIG. 5 is a schematic diagram showing an example of a section of a vacuum chuck described in Embodiment 1. As shown in FIG. 4, an chucking area 232 is formed at a predetermined pitch specified in the SEMI standard, on an electrostatic chuck member 230. The backside of a substrate being the target workpiece 101 is chucked to the chucking area 232 and corrected to be a flat surface. When the target workpiece 101 is an EUV mask, it will be used in exposing EUV light by a exposing apparatus in a latter procedure. In the case of an exposing apparatus, it is held (namely, electrostatic-chucked) by an electrostatic chuck member specified in the SEMI standard, in the exposing apparatus. Therefore, when measuring an EUV mask using the position measuring apparatus 600, it is desirable to reproduce a state equivalent to the state of being held by the electrostatic chuck.

Then, in Embodiment 1, as shown in FIG. 5, a contact area 244 and an adsorption portion 242 are formed on the vacuum chuck member 240 to have the same shape and area as those of the chucking area 232, at a predetermined pitch specified in the SEMI standard, in a vacuum chuck. As to operations of the chuck, the adsorption portion 242 serving as an opening portion is absorbed by a vacuum pump through a flow passage formed inside the vacuum chuck member 240. Although not illustrated herein, in the state of the vacuum chuck member 240 being mounted on the stage 620, a substrate is chucked by the vacuum pump 680 through the inside of the stage 620 and the vacuum chuck member 240. In this way, the target workpiece 101 is attached to the contact area 244.

As mentioned above, by forming the area and the shape of the chucking surface of the vacuum chuck member 240 to be in accordance with the area and the shape of the chucking surface of the electrostatic chuck member specified in the SEMI standard, it is possible, when holding by a vacuum chuck, to set the same conditions as the case of holding by an electrostatic chuck. Therefore, when measuring a position of a pattern corrected so that it might be written at the same position as the case of being corrected to be a flat surface in the case of holding a substrate backside being the target workpiece 101 by the electrostatic chuck specified in the SEMI standard, what is necessary is just to put the substrate on the vacuum chuck member 230. By virtue of this, it is possible to check whether the pattern is written at a desired position on the substrate in the state of being held on the stage 620 by the vacuum chuck like the case of being held by the electrostatic chuck.

On the other hand, when measuring a position of a pattern for which correction on the supposition of holding by the electrostatic chuck specified in a SEMI standard has not been performed, it is enough to mount the substrate on the three-point support member 220. Thereby, it can be checked whether the pattern is written at the desired position on the substrate in the state of being held by three-point support on the stage 620.

That is, according to embodiments of the present invention, it is possible to perform correction for writing at the same pattern position as the case of using an electrostatic chuck, by correcting a position of a writing at its written position without using the electrostatic chuck, in the pattern writing apparatus. Hereafter, it will be explained with reference to figures.

First, when writing an EUV mask, mask topography measurement is performed as follows before a writing JOB registration. That is, after eliminating the influence of the mask gravity sag beforehand from the substrate backside topography of an EUV mask, only the shape of the backside peculiar to the substrate is measured by a flatness measuring apparatus. Furthermore, when the measurement is executed, a high-precision measuring apparatus using an interferometer which is not incorporable in the pattern writing apparatus is utilized. Thereby, the shape of the backside of the mask can be measured sufficiently precisely.

Figure 6:
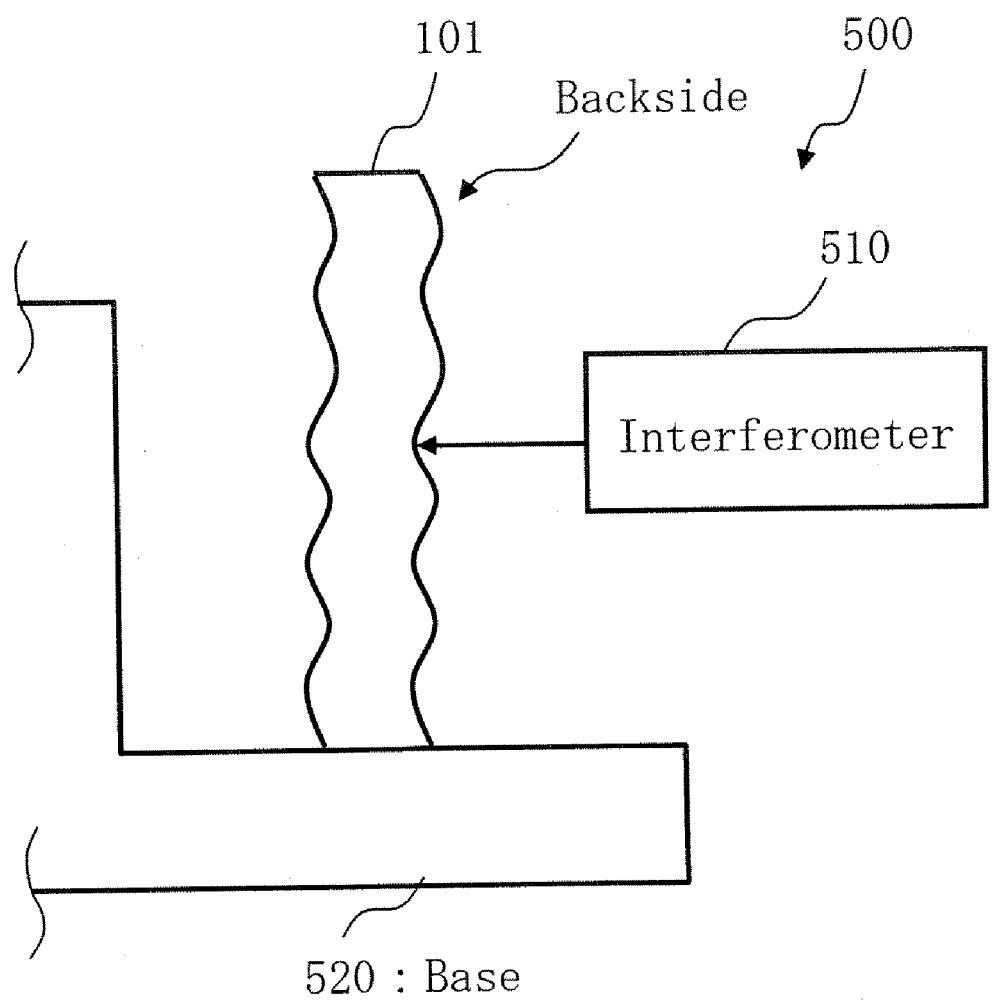
FIG. 6 is a schematic diagram for explaining a method of measuring the backside topography of a substrate by using a flatness measuring apparatus described in Embodiment 1.

FIG. 6 is a schematic diagram for explaining a method of measuring a substrate backside topography by using a flatness measuring apparatus in accordance with Embodiment 1. First, when measuring the substrate backside topography before the writing JOB registration, for example, the substrate being a target workpiece 101 is laid lengthwise on a base 520 as shown in FIG. 6. Then, utilizing an interference principle, an interferometer 510 measures the facing whole surface of the target workpiece 101. By virtue of this method, it is possible to measure highly accurately. Thereby, the influence of the mask substrate gravity sag can be minimized, and only the shape of the backside peculiar to the substrate can be measured with sufficient reproducibility.

A positional deviation of a pattern is calculated based on the measured backside shape information peculiar to the substrate. At the time of a writing registration, the positional deviation, calculated as one of parameters peculiar to the substrate, is inputted. Then, the coordinate system of the writing pattern is converted based on the calculated positional deviation. The position of the writing pattern can be corrected as if the pattern were written based on the coordinate system of the case of being held by a chuck to be an ideal flat surface. That is, the positional deviation can be corrected. As to a substrate holding method, the mechanical three-point support method by which a substrate can be held with sufficient reproducibility is used as an established technique.

Figure 7:
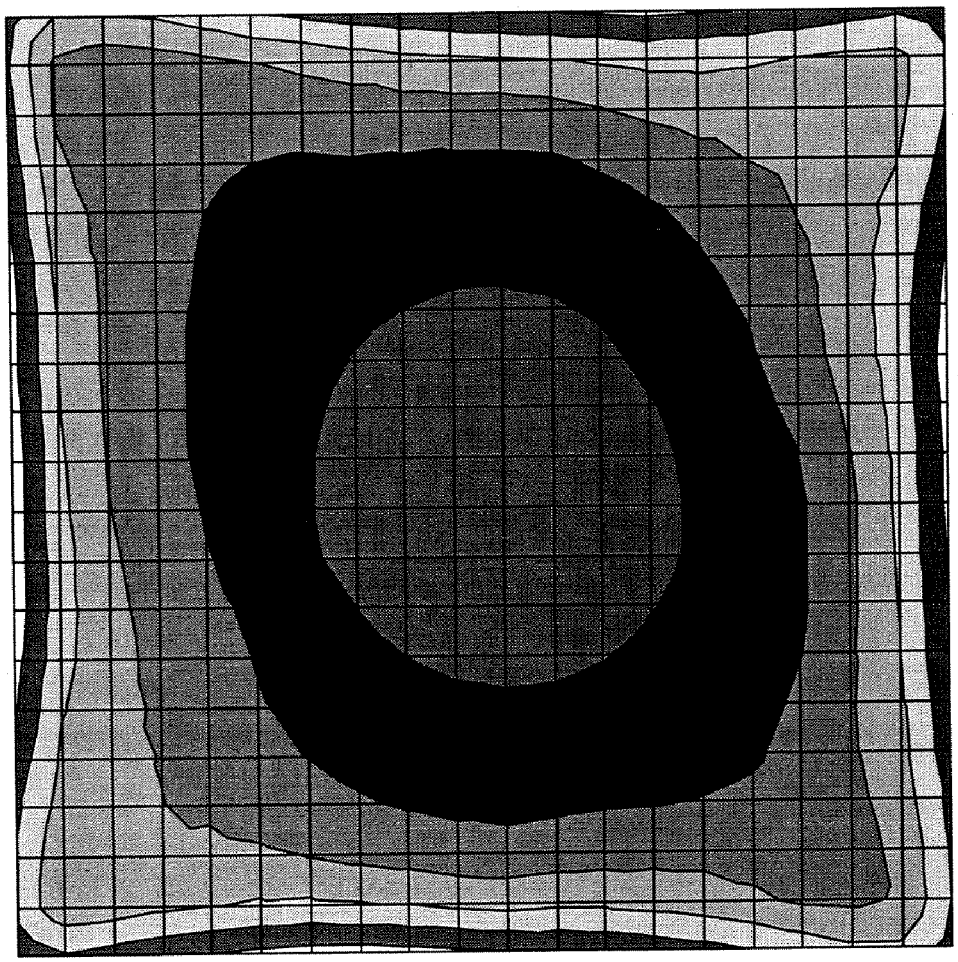
FIG. 7 is shows an example of the backside topography of a substrate described in Embodiment 1.

FIG. 7 shows an example of the backside topography of a substrate in accordance with Embodiment 1. As shown in the figure, the substrate backside has a peculiar topography caused by not only the deformation by the gravity sag but also the imperfection of processing of polishing the surface.

As an approximation calculation step, data of the substrate backside topography, measured by a flatness measuring apparatus are inputted to the pattern writing apparatus. The topography data concerning the substrate backside, being backside topography information peculiar to the substrate, is performed fitting (approximation) by the fourth polynomial.

As a gradient calculation step, a local gradient is calculated from a differentiation value of the approximated fourth polynomial expression.

Next, as a positional deviation calculation step, a pattern positional deviation (first positional deviation) at the time of writing a pattern on the frontside of the substrate whose backside has been corrected to be a flat surface is calculated based on the substrate backside topography.

Figure 8:
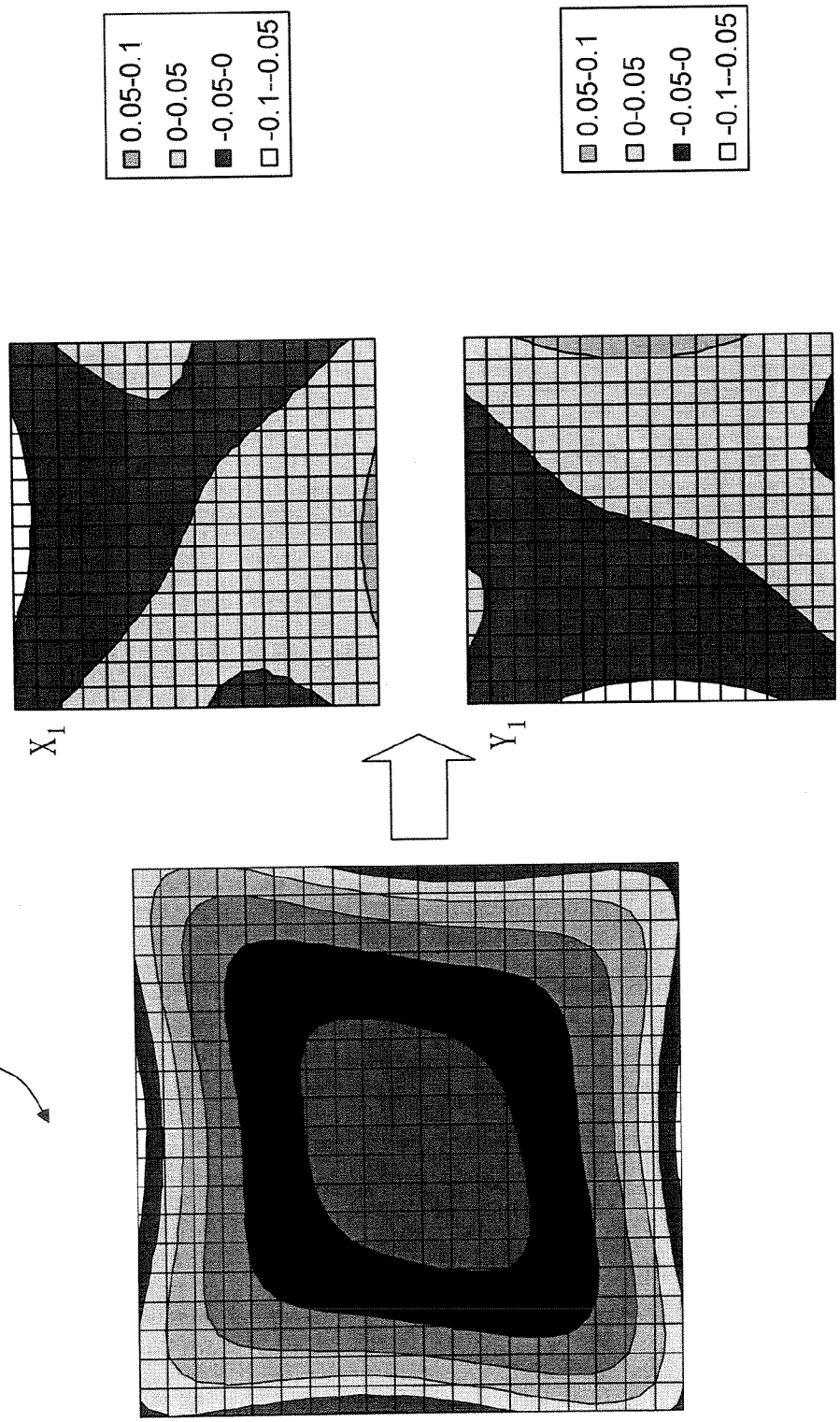
FIG. 8 shows an example of a three-dimensional shape, for which fitting has been performed, of the backside of a substrate described in Embodiment 1.

FIG. 8 shows an example of the substrate backside topography described in Embodiment 1, for which fitting has been performed. The substrate backside topography shown in FIG. 7 is performed fitting, using the fourth polynomial expression. Furthermore, partial differential is performed for each of X and Y which are orthogonal. Local gradient distributions with respect to the directions of X and Y are obtained, and the obtained distributions are shown in FIG. 8.

Figure 9:
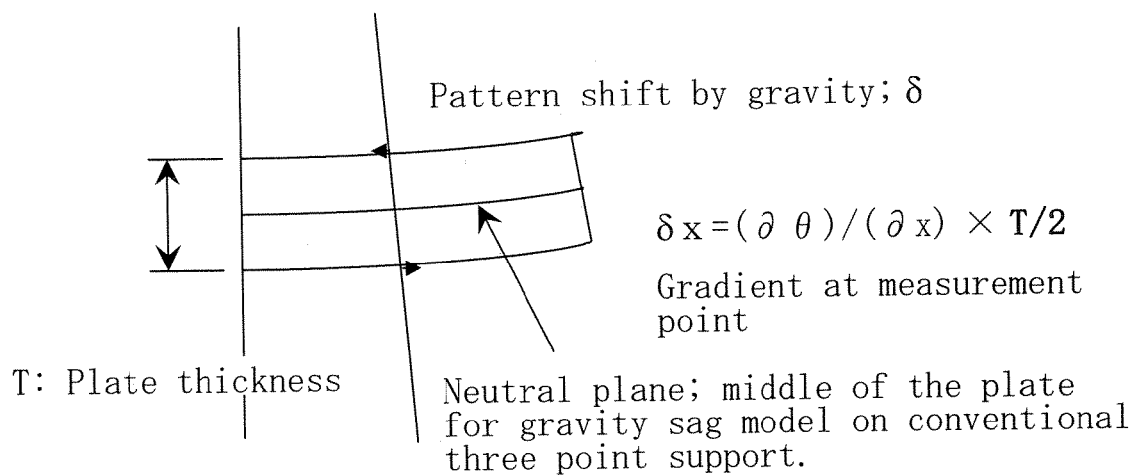
FIG. 9 is a schematic diagram for explaining a method of calculating a positional deviation described in Embodiment 1.

FIG. 9 is a schematic diagram for explaining a method of calculating a positional deviation in Embodiment 1. Extracting a local part, it will be explained with reference to FIG. 9. The thickness of the substrate being a target workpiece 101 is defined as T, and the neutral plane having no elasticity is defined as the center of the substrate. At this time, in the case of a local gradient θ being calculated by a gradient calculation unit 454, if the backside topography is corrected to be a flat surface like the case of the backside being held by an electrostatic chuck, a positional deviation or "pattern shift" δ (x, y) is generated on the substrate frontside. In the case of the mask tightly chucked and contacted to the electrostatic chuck, since a frictional force is generated between the mask and the electrostatic chuck, there is a possibility of the neutral plane deviating from the center of the substrate and shifting to the electrostatic chuck surface side, depending upon a force balance. In that case, the pattern positional deviation δ at the frontside of the mask can be calculated by multiplying a local gradient Δ θ by the thickness T of the substrate and a proportionality coefficient k. In this way, distribution of the positional deviation of the pattern at the time of writing a pattern on the frontside of the substrate being the target workpiece 101 can be obtained.

Figure 10:
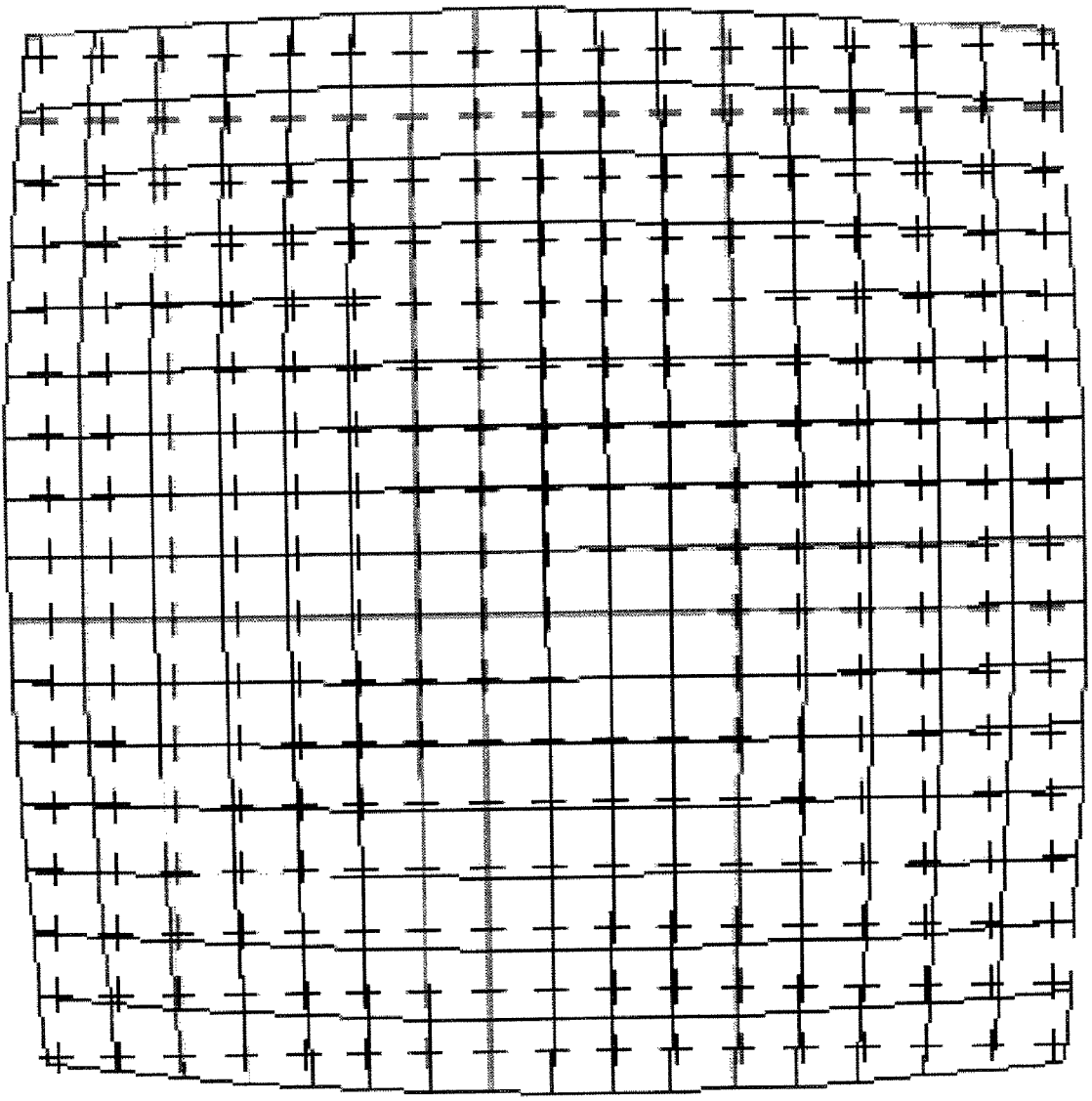
FIG. 10 shows an example of positional deviation distribution of a pattern on the frontside of a substrate described in Embodiment 1.

FIG. 10 shows an example of expected distribution of a pattern positional deviation of the frontside of the substrate with the correction of the substrate backside topography in Embodiment 1. As shown in the figure, the distribution of the pattern positional deviation of the substrate surface, generated only by the backside topography peculiar to the substrate, can be obtained based on the calculation mentioned above.

As a coefficient calculation step, a coefficient (first coefficient) of an approximate expression (first approximate expression) indicating a positional deviation correction amount for correcting the positional deviation is calculated based on the obtained positional deviation. The approximate expression of the positional deviation correction amount in Embodiment 1 can be obtained by the following expressions (1-1) and (1-2):

$$x_1 = a_{10} + a_{11}x + a_{12}y + a_{13}x^2 + a_{14}xy + a_{15}y^2 + a_{16}x^3 + a_{17}x^2y + a_{18}xy^2 + a_{19}y^3 \quad (1\text{-}1)$$

$$y_1 = b_{10} + b_{11}x + b_{12}y + b_{13}x^2 + b_{14}xy + b_{15}y^2 + b_{16}x^3 + b_{17}x^2y + b_{18}xy^2 + b_{19}y^3 \quad (1\text{-}2)$$

Based on the positional deviation of the positional deviation distribution obtained in FIG. 10, a grid correction amount (positional deviation correction amount) written by fitting of a third polynomial expression can be calculated. A coefficient $(a_{10}, a_{11}, \ldots, a_{19})$ with respect to the direction X shown in the expression (1-1) and a coefficient $(b_{10}, b_{11}, \ldots, b_{19})$ with respect to the direction Y shown in the expression (1-2), which are necessary for approximating a third polynomial expression of the direction X and the direction Y, are obtained by calculation. Assuming that such coefficients are parameters, it is possible to correct the positional deviation based on the deformation amount peculiar to the substrate backside topography, that gravity sag is free, can be corrected in the pattern writing apparatus. What is obtained by adding the coefficients of the polynomial expressions obtained here, to the coefficient of the third polynomial expression used in the usual case of having no backside correction as mentioned below, is used for writing of the substrate.

In a writing apparatus, when holding a substrate by a three-point support, meaning clamping at three points described below, the following is generated: a positional deviation at pattern writing time, generated because of deformation caused by gravity sag of the target workpiece 101 being a mask substrate, and a positional deviation peculiar to coordinates of the system, generated by movement of the XY stage or an error of a mirror for position measurement, etc. Therefore, in advance, a coefficient (second coefficient) of the approximate expression (second approximate expression) indicating a positional deviation correction amount for correcting the positional deviation peculiar to the coordinates of the system is prepared beforehand as a default value. The approximate expression of the amount of correction of the positional deviation peculiar to the system can be given by the following expressions (2-1) and (2-2).

$$x_0 = a_{s0} + a_{s1}x + a_{s2}y + a_{s3}x^2 + a_{s4}xy + a_{s5}y^2 + a_{s6}x^3 + a_{s7}x^2y + a_{s8}xy^2 + a_{s9}y^3 \quad (2\text{-}1)$$

$$y_0 = b_{s0} + b_{s1}x + b_{s2}y + b_{s3}x^2 + b_{s4}xy + b_{s5}y^2 + b_{s6}x^3 + b_{s7}x^2y + b_{s8}xy^2 + b_{s9}y^3 \quad (2\text{-}2)$$

As stated above, in the pattern writing apparatus, since the mask substrate for EUV being the target workpiece 101 is horizontally held by the clamps at three points without using the electrostatic chuck, a positional deviation at the time of pattern writing, because of deformation caused by the gravity sag of the target workpiece 101 being the writing mask substrate, is generated. In addition, a positional deviation peculiar to the system, mentioned the above, arises. Therefore, in order to correct these positional deviations, a grid correction amount (positional deviation correction amount) written by performing fitting of the third polynomial expressions, namely the expression (2-1) and the expression (2-2), is calculated beforehand. A coefficient with respect to X direction ($a_{s0}, a_{s1}, \ldots, a_{s9}$) shown in the expression (2-1) and a coefficient with respect to Y direction ($b_{s0}, b_{s1}, \ldots, b_{s9}$) shown in the expression (2-2), which are required for approximating the third polynomial expression with respect to X direction and Y direction, are calculated beforehand. The coefficient (second coefficient) of the approximate expression (second approximate expression) indicating the positional deviation correction amount is stored as a default value.

Thus, the approximate expression indicated by the expressions (2-1) and (2-2) shows the positional deviation correction amount for correcting the positional deviation (second positional deviation) of the pattern in the case of writing a pattern on the surface of a substrate, without correcting the substrate backside to be a flat surface.

As an addition step, using the coefficient (second coefficient) of the approximate expression (second approximate expression) shown by the expressions (2-1) and (2-2), the first coefficient is added to the second coefficient. The approximate expression of the positional deviation correction amount after having been added can be given by the following expressions (3-1) and (3-2).

$$X_1 = (a_{s0}+a_{10}) + (a_{s1}+a_{11})x + (a_{s2}+a_{12})y + (a_{s3}+a_{13})x^2 + (a_{s4}+a_{14})xy + (a_{s5}+a_{15})y^2 + (a_{s6}+a_{16})x^3 + (a_{7}+a_{17})x^2y + (a_{s8}+a_{18})xy^2 + (a_{s9}+a_{19})y^3 \quad (3\text{-}1)$$

$$Y_1 = (b_{s0}+b_{10}) + (b_{s1}+b_{11})x + (b_{s2}+b_{12})y + (b_{s3}+b_{13})x^2 + (b_{s4}+b_{14})xy + (b_{s5}+b_{15})y^2 + (b_{s6}+b_{16})x^3 + (b_{7}+b_{17})x^2y + (b_{s8}+b_{18})xy^2 + (b_{s9}+b_{19})y^3 \quad (3\text{-}2)$$

Based on the approximation expression shown by the expressions (3-1) and (3-2), it is possible to obtain a positional deviation correction amount which is calculated by adding each coefficient of the third polynomial expression, and adding the correction amount of positional deviation peculiar to the system to the correction amount of positional deviation peculiar to the substrate backside topography that gravity sag is free.

In Embodiment 1, the case has been described in which the third polynomial expression is used as an approximate expression indicating the positional deviation correction amount for correcting the positional deviation peculiar to the coordinates of the system of the electron beam pattern writing apparatus. However, it is also applicable to use a polynomial expression having an order of fourth or more. In that case, it is desirable for the polynomial expression which performs fitting of the topography showing the backside of an EUV mask, to have an order of +1, in order to be in accordance with the order of the approximate expression indicating the positional deviation correction amount for correcting the positional deviation peculiar to the coordinates of the system of the pattern writing apparatus. That is, when the approximate expression indicating the positional deviation correction amount for correcting the positional deviation peculiar to the coordinates of the system of the pattern writing apparatus is the fourth polynomial expression, it is desirable to perform approximation by using the fifth polynomial expression.

Figure 11:
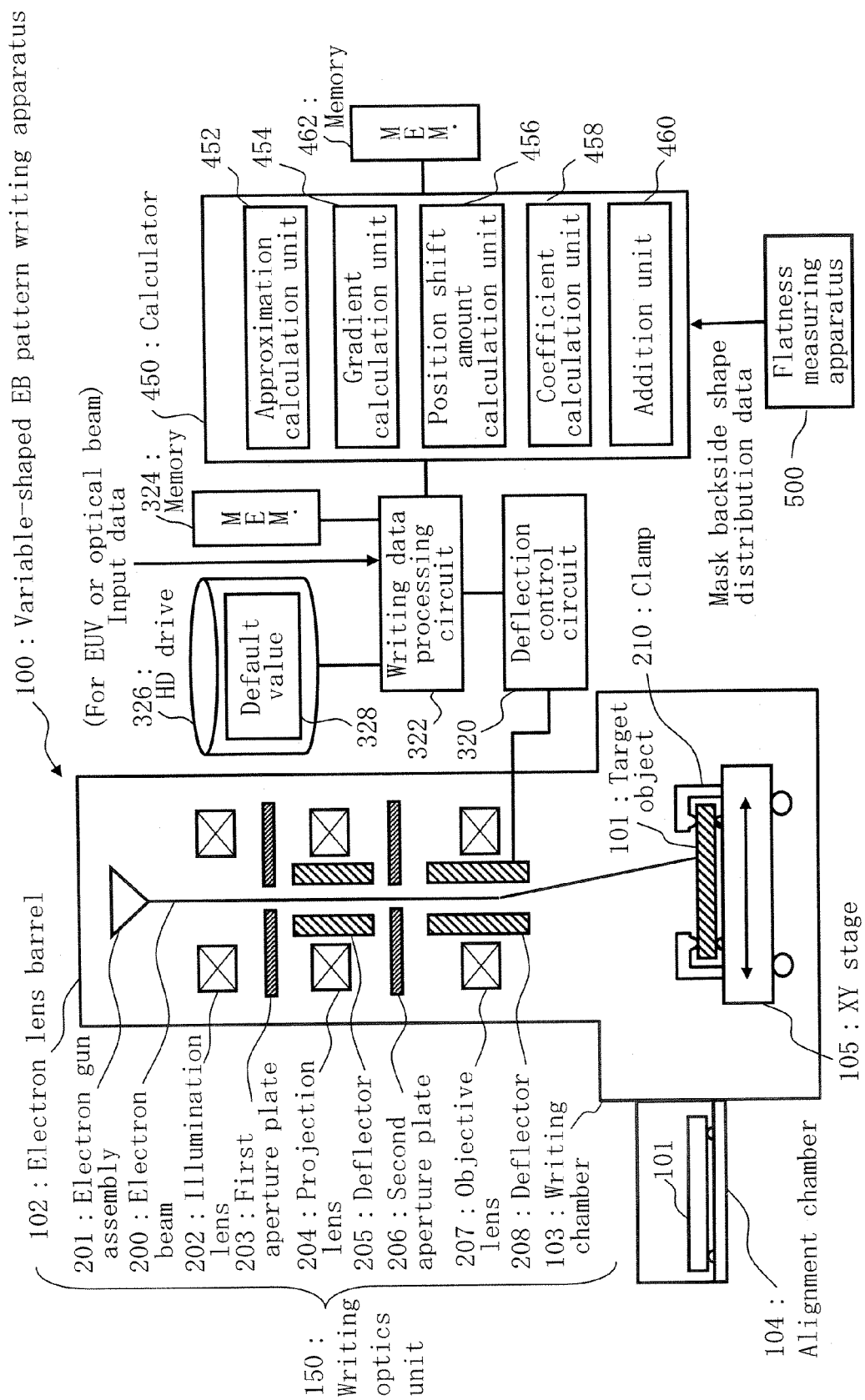
FIG. 11 is a schematic diagram showing a structure of a pattern writing apparatus described in Embodiment 1.

FIG. 11 is a schematic diagram showing a structure of the pattern writing apparatus described in Embodiment 1. As shown in the figure, a variable-shaped EB pattern writing apparatus 100, which is an example of a charged particle beam pattern writing apparatus, includes a writing optics unit 150 composed of an electron lens barrel 102, a writing chamber 103, an XY stage 105, an electron gun assembly 201, the illumination lens 202, a first or "upper" aperture plate 203, a projection lens 204, a deflector 205, a second or "lower" aperture plate 206, an objective lens 207, and a deflector 208. In addition, the variable-shaped EB pattern writing apparatus 100 includes, as a control part, a writing data processing circuit 322, a deflection control circuit 320, a calculator 450, a memory 462, a memory 324, and a hard disk (HD) drive 326 being an example of a magnetic disk drive. The deflection control circuit 320, the calculator 450, the memory 324, and the HD drive 326 are connected to the writing data processing circuit 322. Moreover, the memory 462 is connected to the calculator 450. In the HD drive 326, the coefficients of the approximation of the expressions (2-1) and (2-2) are stored as default values 328 mentioned above. The approximation of the expressions (2-1) and (2-2) indicates a positional deviation correction amount for correcting a positional deviation when pattern is written, generated because of deformation caused by gravity sag of the target workpiece 101 being a mask substrate, and a positional deviation peculiar to coordinates of the system, generated by movement of the XY stage 105 or an error of a mirror for position measurement (not illustrated), etc.

In the electron lens barrel 102, the electron gun assembly 201, the illumination lens 202, the first aperture plate 203, the projection lens 204, the deflector 205, the second aperture plate 206, the objective lens 207, and the deflector 208 are arranged. In the writing chamber 103, the XY stage 105 is arranged. On the XY stage 105, the target workpiece 101 is held by clamps 210 at three points. Moreover, an alignment chamber 104 is connected to the writing chamber 103, and alignment (position alignment) and homoiothermal processing are performed for the target workpiece 101 before being loaded to the writing chamber 103.

The calculator 450 has functions of an approximation calculation unit 452, a gradient calculation unit 454, a positional deviation calculation unit 456, a coefficient calculation unit 458, and an addition unit 460. Topography data on the backside of a mask is inputted into the calculator 450 from a flatness measuring apparatus 500 being an external apparatus. Moreover, information including data which indicates whether it is for an EUV mask or for a general optical mask other than EUV is input into the writing data processing circuit 322.

Structure elements required for describing Embodiment 1 are illustrated in FIG. 11, and it is also applicable to other structure elements usually needed for the variable-shaped EB pattern writing apparatus 100 are included. Moreover, processing of each function, such as the approximation calculation unit 452, the gradient calculation unit 454, the positional deviation calculation unit 456, the coefficient calculation unit 458, and the addition unit 460 is performed in the calculator 450 serving as an example of a computer, in FIG. 11. However, it is not restricted to this. It is also applicable to execute it by hardware of an electric circuit. Alternatively, it may be executed by combination of hardware and software, or combination of hardware and firmware.

An electron beam 200, being an example of a charged particle beam and leaving the electron gun assembly 201, is irradiated or "shot", by the illumination lens 202, onto the whole of a rectangular opening, for example, which is formed in the first aperture plate 203. At this point, the electron beam 200 is shaped to have a rectangular shape, for example. Then, after having passed through the first aperture plate 203, the electron beam 200 of a first aperture image is guided by the projection lens 204 to reach the second aperture plate 206. The position of the first aperture image on the second aperture plate 206 is controlled by the deflector 205, and thereby the shape and size of the beam can be changed. After having passed through the second aperture plate 206, the electron beam 200 of a second aperture image is focus-adjusted by the objective lens 207 on the one hand, and deflected by the deflector 208 on the other hand, to reach a desired position on the target object 101, which is movably placed, on the XY stage 105. The deflecting voltage of the deflector 208 is controlled by the deflection control circuit 320.

Figure 12:
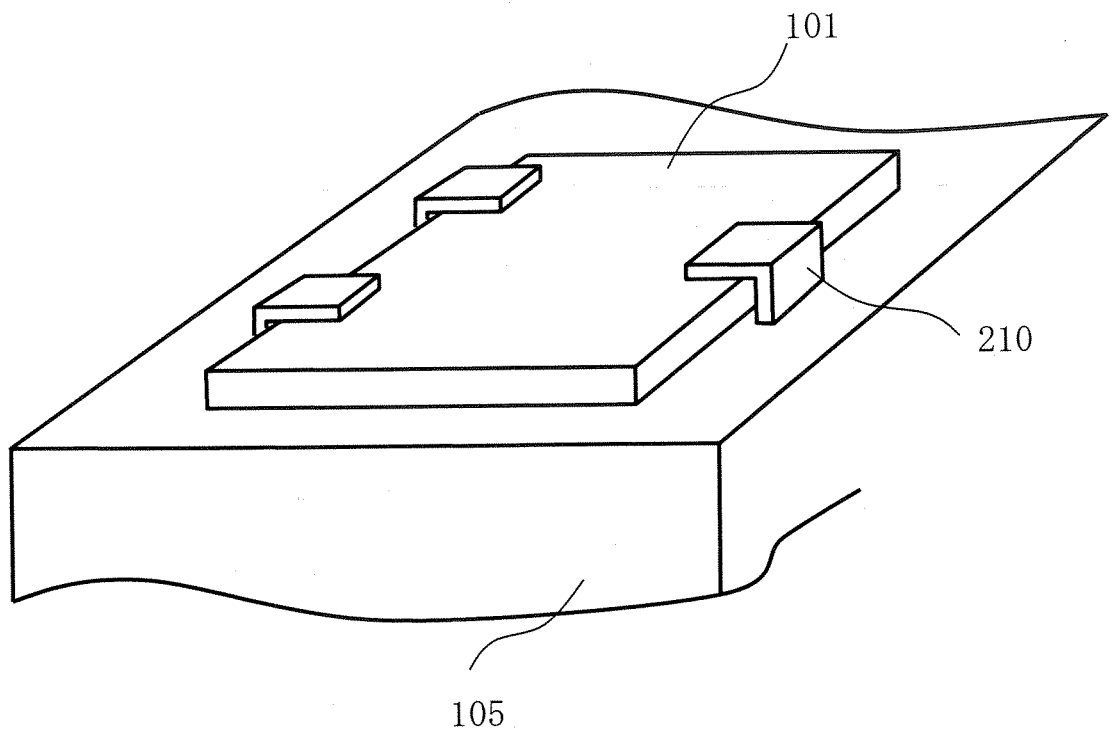
FIG. 12 is a schematic diagram showing an example of a state of holding a substrate described in Embodiment 1.

FIG. 12 is a schematic diagram showing an example of a state of holding a substrate in accordance with Embodiment 1. As shown in the figure, the target workpiece 101 being a substrate is held and clamped by clamps 210 at three points on the XY stage 105.

Figure 13:
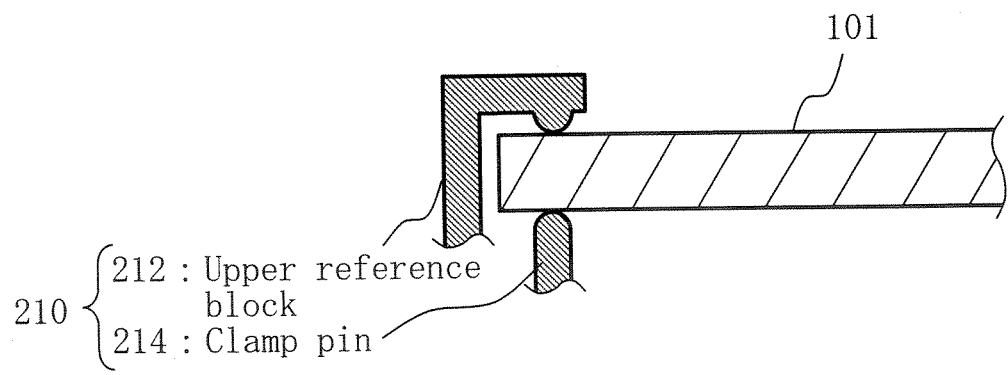
FIG. 13 is a sectional schematic diagram showing an example of a state of holding a substrate described in Embodiment 1.

FIG. 13 is a sectional schematic diagram showing an example of a state of holding a substrate in accordance with Embodiment 1. The clamp 210 includes an upper reference block 212 and a clamp pin 214, and has a structure of catching the target workpiece 101 from the frontside side by the upper reference block 212, and from the backside side by the clamp pin 214, namely clamping the same axis from the upper and lower sides. By virtue of clamping the target workpiece 101 at three points, the points contacting with the substrate can be minimized. Thus, particulate contamination, such as particles in the case of an electrostatic chuck, can be prevented. Consequently, it is possible to retain the cleanness of the clamp point. In addition, compared with the case of holding at a surface like an electrostatic chuck case, since the holding is performed at three points on the substrate backside, it can be hardly affected by the influence of the error of the substrate backside. As a result, errors can be reduced and excellent reproducibility can be obtained.

However, in the case the target workpiece 101 is an EUV mask, if a pattern is written on the target workpiece 101 in the above-described state, this is not the state that the substrate backside has been corrected to be flat like the case of being held by the electrostatic chuck specified in the SEMI standard. For this reason, if the target workpiece 101 is used as a mask in an exposure apparatus utilizing the electrostatic chucking operation, the position of the pattern exposed onto the wafer etc. will deviate. For example, when the size of the substrate used as the target workpiece 101 is a 152.4 mm square, the area of at least 142 mm square of its central part is chucked by the electrostatic chuck. That is, the area of at least 142 mm square at the central part on the substrate backside is corrected to be flat. Therefore, in the case of writing a pattern on the target workpiece 101 in this state, by virtue of calculating a positional deviation correction amount and using a coefficient added to the default value as a parameter as stated above, it becomes possible to correct the position to receive the electron beam 200 so that the pattern may be written on a predetermined position in the state of the substrate backside being corrected to be flat like the case of being held by the electrostatic chuck specified in the SEMI standard.

Processing of each function of the approximation calculation unit 452, the gradient calculation unit 454, the positional deviation calculation unit 456, the coefficient calculation unit 458, and the addition unit 460 will be explained below.

First, as the approximation calculation step mentioned above, topography data of height distribution of the substrate backside measured by a flatness measuring apparatus is inputted to the calculator 450. The inputted topography data can be stored in the memory 462. The approximation calculation unit 452 reads the topography data of the substrate backside, which is backside shape information peculiar to the substrate, from the memory 462, and performs fitting (approximation) of the topography by a fourth polynomial expression, for example.

Next, as the gradient calculation step mentioned above, the gradient calculation unit 454 calculates a local gradient from a differentiation value of the approximated fourth polynomial expression.

Next, as the positional deviation calculation step mentioned above, the positional deviation calculation unit 456 calculates a positional deviation (first positional deviation) of a pattern when the pattern is written on the frontside of the substrate whose backside has been corrected to be a flat surface, based on the substrate backside topography.

Next, as the coefficient calculation step mentioned above, the coefficient calculation unit 458 calculates a coefficient (first coefficient) of an approximate expression (first approximate expression) indicating a positional deviation correction amount for correcting the positional deviation, based on the obtained positional deviation.

Next, as the addition step mentioned above, the addition unit 460 adds the first coefficient of the approximate expression shown by the expressions (1-1) and (1-2) to the coefficient (second coefficient) of the approximate expression shown by the expressions (2-1) and (2-2). As described above, the approximate expression (second approximate expression) shown by the expressions (2-1) and (2-2) indicates a positional deviation correction amount for correcting the positional deviation (second positional deviation) of a pattern written on the frontside of a substrate without correcting the substrate backside to be a flat surface. The coefficient parameter used as the second coefficient is stored in the HD drive 326 as a default value 328 of the pattern writing apparatus. Therefore, the addition unit 460 reads the default value 328 from the HD drive 326 through the writing data processing circuit 322, and adds the coefficient (first coefficient) obtained by the coefficient calculation unit 458.

Then, as a writing step, the writing unit 150 writes a pattern on the frontside of the substrate being the target workpiece 101, using the electron beam 200, based on a positional deviation correction amount obtained by the approximate expression (third approximate expression) of the expressions (3-1) and (3-2) indicating the positional deviation correction amount using an additional value (third coefficient) acquired as a result of the addition. That is, in the writing data processing circuit 322, information on the positional deviation correction amount obtained by the approximate expression indicating the positional deviation correction amount using the coefficient obtained as a result of the addition is output to the deflection control circuit 320. Then, deflecting voltage controlled by the deflection control circuit 320 is applied to the deflector 208, and the electron beam 200 is deflected to be irradiated onto a predetermined position.

Figure 14:
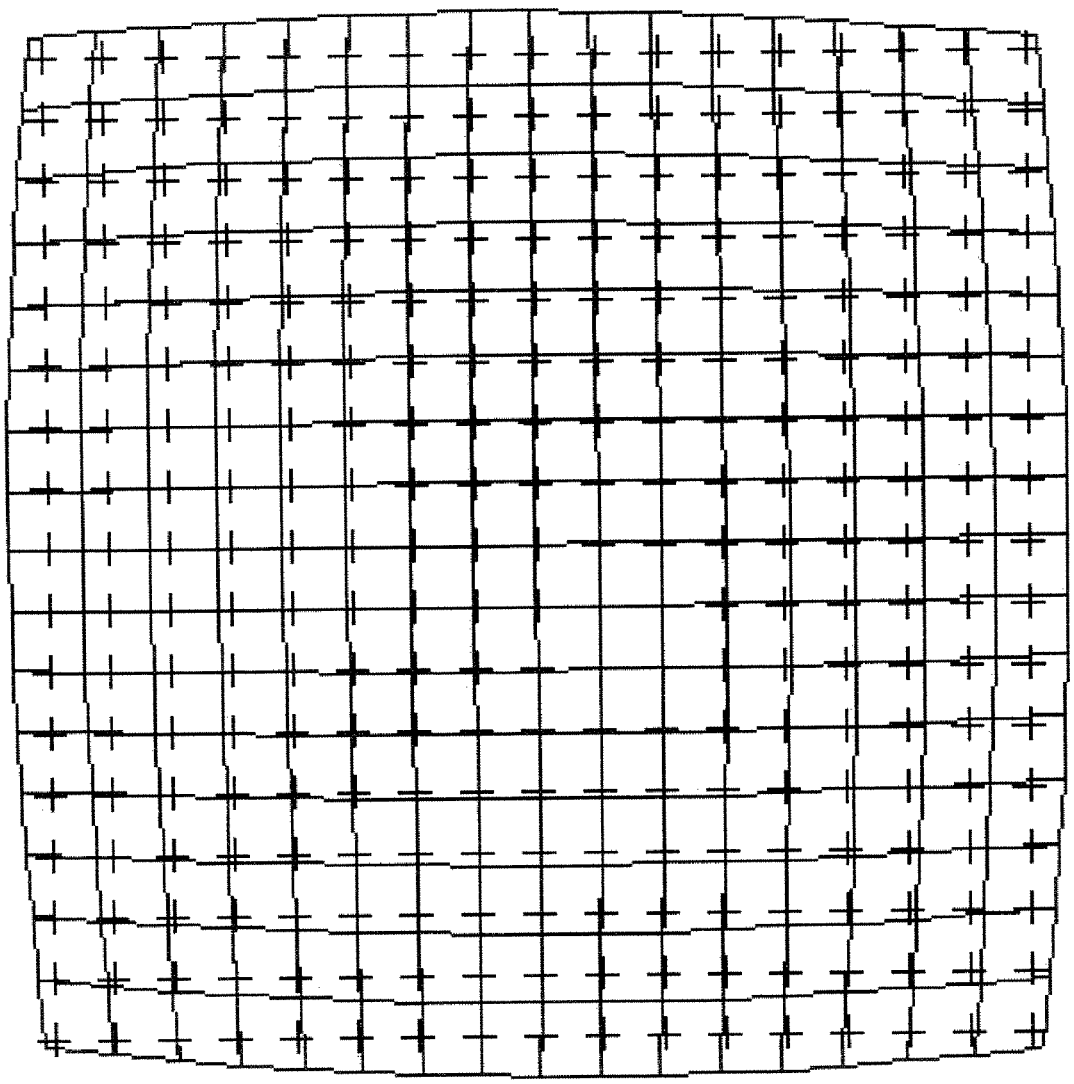
FIG. 14 shows an example of distribution of positional deviation correction amount for correcting deformation by holding on a flat chuck with data of the substrate backside topography obtained without the influence of gravity sag, described in Embodiment 1.

FIG. 14 shows an example of distribution of positional deviation correction amount for correcting the deformation by holding on a flat chuck with data of the substrate backside topography obtained without the influence of gravity sag in Embodiment 1.

Figure 15:
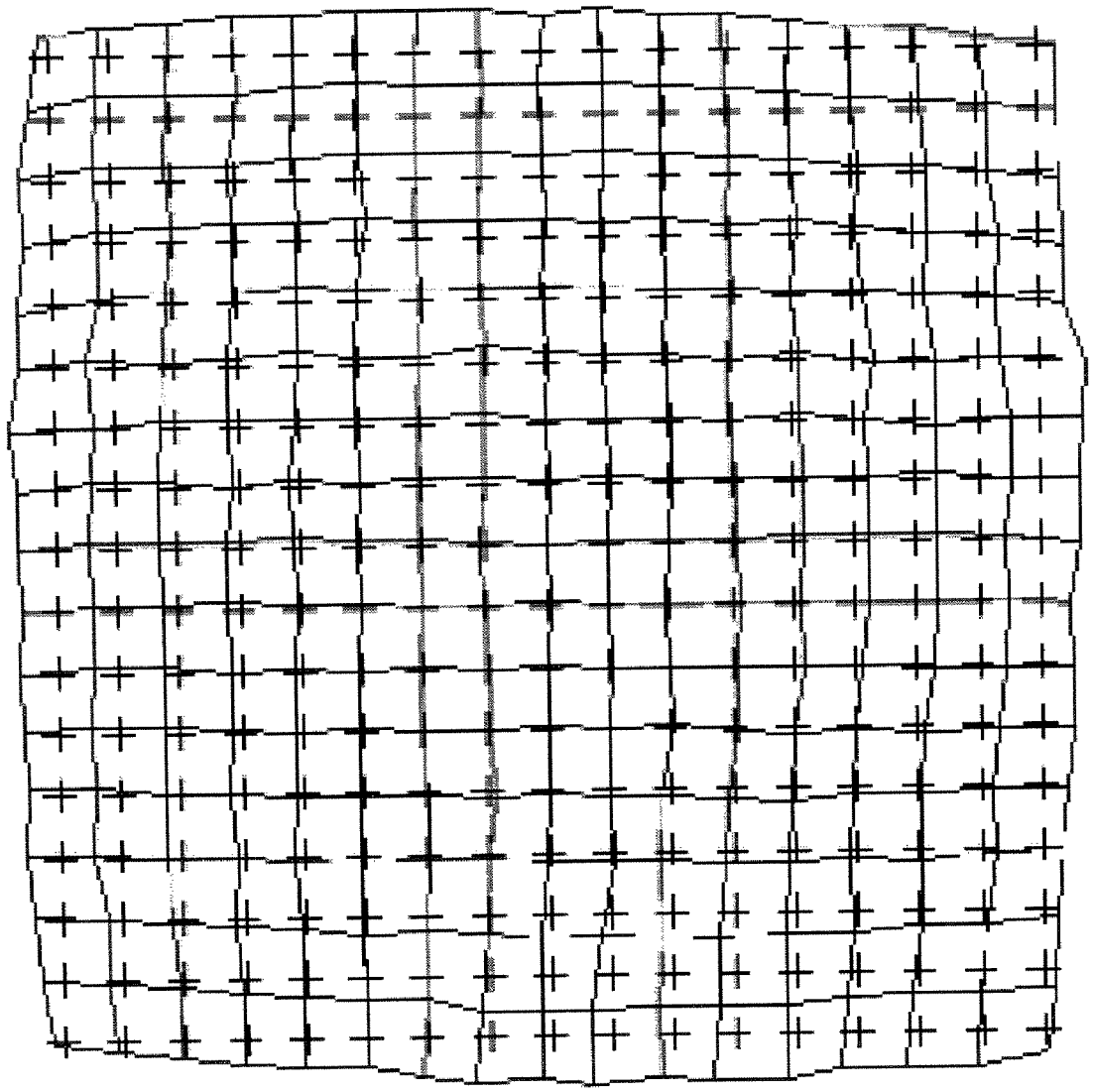
FIG. 15 shows an example of pattern position distribution of an EUV mask written with positional deviation correction for correcting deformation by holding on a flat chuck with data of the substrate backside topography obtained without the influence of gravity sag, described in Embodiment 1.

FIG. 15 shows an example of pattern position distribution of an EUV mask written with positional deviation correction for correcting deformation by holding on a flat chuck with data of the substrate backside topography obtained without the influence of gravity sag in Embodiment 1.

Figure 16:
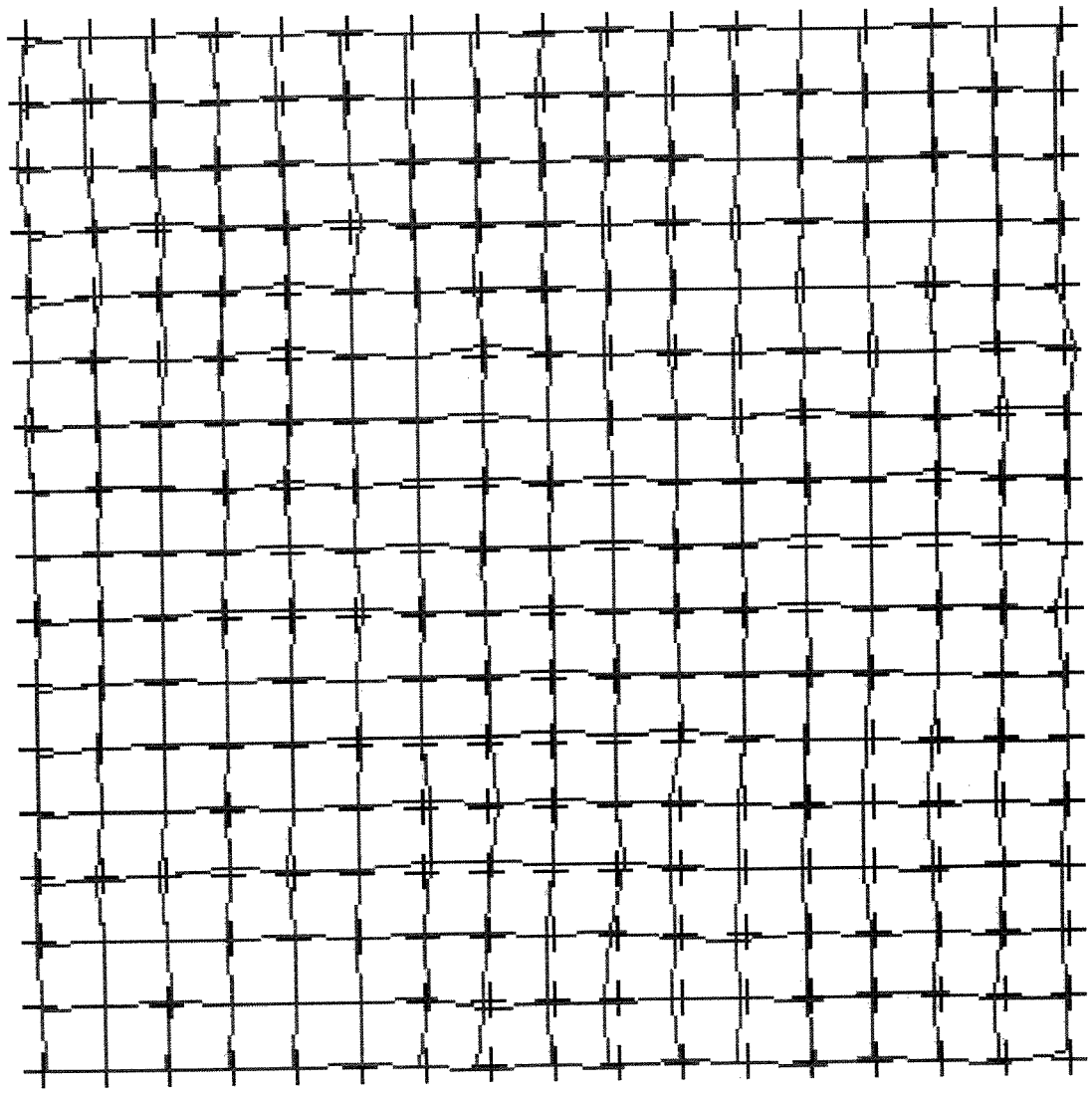
FIG. 16 shows distribution of positional deviation between FIG. 14 and FIG. 15.

FIG. 16 shows distribution of positional deviation between FIGS. 14 and 15. In FIG. 16, deformation, such as varying the distribution, is not shown and the shape becomes almost a square, it turns out that the predicted positional deviation correction amount shown in FIG. 14 is right and the positional deviation correction according to Embodiment 1 is effective.

As mentioned above, even when writing is performed without using an electrostatic chuck, it can be corrected to be the same position as that of using the electrostatic chuck, by adding the coefficient (first coefficient) obtained by the coefficient calculation unit 458 to the default value 328. In other words, even when writing on the substrate for EUV mask serving as the target workpiece 101 horizontally held by the three clamps 210 and written using the variable-shaped EB pattern writing apparatus 100, it can be corrected to be the same position as that of the case using the electrostatic chuck.

As mentioned above, it is possible in a pattern writing apparatus to correct a pattern position to be the one as using the electrostatic chuck even if the electrostatic chuck is not used. Then, position accuracy of the pattern writing apparatus and position accuracy of the pattern on the wafer held by the electrostatic chuck in an exposure apparatus are able to evaluate by a position measuring apparatus in Embodiment 1.

In the position measuring apparatus, when measuring a position of a pattern written on an EUV mask being printed onto a wafer, a vacuum chuck is selectively used to measure. When measuring a position accuracy of a pattern in order to manage conditions of the pattern writing apparatus which writes an EUV mask, the ordinary three-point support is selectively used to measure.

Now, the operation of the position measuring apparatus 600 in the case of the pattern written on the EUV mask being printed onto a wafer will be explained. First, the transfer robot 640, using the hand 642, takes out the second set utilizing the vacuum chuck as mentioned above from the holder 650, loads it to the stage 620, and mounts it on the stage 620. Then, in the state of the vacuum chuck member 240 being mounted on the stage 620, the vacuum chuck member 240 is exhausted by the vacuum pump 680 through the stage 620. Thereby, the target workpiece 101 mounted on the vacuum chuck member 240 is chucked through the vacuum chuck member 240, and attached to the vacuum chuck member 240 to be held by the chuck.

With keeping such state, the stage 620 is moved in the XY directions by the stage control circuit 674, and the pattern written on the EUV mask is recognized by the pattern position recognition unit 610 to be imaged. Then, the imaged picture is sent to the calculator 660, with position information controlled by the position control system 622. The position of the pattern written on the EUV mask is measured based on the imaged picture and the position information. By measuring the position of the pattern written on the EUV mask, a positional deviation from a desired position can be measured under the same conditions as the chucking operation by the electrostatic chuck.

Next, operations of the position measuring apparatus 600 in the case of measuring a position of a pattern in order to manage conditions of the pattern writing apparatus which writes the EUV mask will be explained. Using the hand 642, the transfer robot 640 takes out the first set utilizing a three-point support from the holder 650, loads it to the stage 620, and mounts it on the stage 620. Since the target workpiece 101 is just mounted on the three-point support member 220, with retaining this state, the stage 620 is moved in the XY directions by the stage control circuit 674, and the pattern written on the EUV mask is recognized by the pattern position recognition unit 610 to be imaged. Then, the imaged picture is sent to the calculator 660 with position information controlled by the position control system 622. The position of the pattern written on the EUV mask is measured based on the imaged picture and the position information.

If this pattern on the EUV mask is written for the purpose of managing conditions of the pattern writing apparatus without correcting the backside topography, it is possible, by measuring the position of the pattern, to measure the positional deviation from a desired position in the case of being clamped at three places by the clamp 210 of the variable-shaped EB pattern writing apparatus 100. That is, positioning accuracy of the pattern of writing apparatus can be evaluated.

As stated above, by arranging the three-point support member 220 and the vacuum chuck member 240 in the holder 650, a member for holding the substrate to be used on the stage 620 can be selected. When the vacuum chuck member 240 is selected, it is possible to execute a vacuum chucking operation to the substrate, by way of absorbing the substrate backside by the vacuum pump 680 through the vacuum chuck member 240. Then, the position of the pattern on the substrate, held by either one selected from the three-point support member 220 and the vacuum chuck member 240, can be recognized by the pattern position recognition unit 610.

As mentioned above, when evaluating accuracy of a position which is assumed when the pattern written on the EUV mask is printed onto a wafer, it is possible, by using the vacuum chuck, to evaluate whether backside topography correction, executed in the pattern writing apparatus, functions correctly or not. Moreover, by using the ordinary three-point support which can hold the substrate with excellent reproducibility and little possibility of adhesion of particulate contamination, it is possible to measure whether it is written as the backside topography correction carried out in the pattern writing apparatus or not, under the same conditions as those of the pattern writing apparatus. As a result, accuracy evaluation of the mask pattern writing apparatus for writing an EUV mask can be performed.

Moreover, as a positional deviation measuring method, it is preferable to selectively use the vacuum chuck or the three-point support depending upon a pattern for which backside topography correction having been performed or a pattern not having been performed. In other words, as a first positional deviation measurement step, when a pattern is written on the substrate frontside whose backside has been corrected to be flat like the case of holding using the electrostatic chuck specified in the SEMI standard, based on the substrate backside topography without the influence of gravity sag, the first pattern positional deviation is measured with performing the vacuum chuck to the substrate backside, using the first pattern written after correcting a predicted positional deviation of the pattern.

As a second positional deviation measurement step, the second pattern positional deviation is measured with the substrate backside being held by the three-point support, using the second pattern written after correcting a predicted positional deviation of the pattern written on the substrate frontside, without correcting the substrate backside to be flat.

By measuring as mentioned above, it is possible to check, in the state of being held by the vacuum chuck, whether a pattern is written at the same position as the case of the substrate backside having been corrected to be flat like the case of being held by the electrostatic chuck specified in the SEMI standard. Consequently, the validity of the correction amount of correcting in the state of being held and kept clean similar to the case of holding by the electrostatic chuck can be confirmed. Meanwhile, it is possible to check whether the pattern has been written at a desired position, in the case of the substrate backside being not corrected to be flat like the case of holding the substrate backside at three points without using the electrostatic chuck specified in the SEMI standard. As a result, the validity of the coefficient of the above-stated default value used as the positional deviation correction amount peculiar to the pattern writing apparatus can be confirmed. Thus, it is possible to confirm the position accuracy of both the patterns: a pattern corrected on the supposition that holding is performed by the electrostatic chuck, and a pattern not corrected.

With respect to the material of the vacuum chuck member 240, it is desirable to use the one harder than the material used for the electrostatic chuck member specified in the SEMI standard, for example, SiC (silicon carbide). That is, according to the SEMI standard (SEMI P40-1103), it is specified to use material of low thermal expansion, as the electrostatic chuck material. For example, it is known to use Zerodur which is low-thermal-expansion glass ceramic. By using a material harder than the above one, a deformation amount of those materials at the time of performing chucking to the target workpiece 101 can be smaller than the one in the case of performing the electrostatic chuck. Since the deformation amount can be reduced, it is possible to make the substrate backside be close to an ideal plane shape, with the chucked state. Thus, reproducibility can be improved than the case of the electrostatic chuck being performed.

According to the present Embodiment, as mentioned above, it is possible to check positional deviation of a pattern corrected on the assumption that it is held by an electrostatic chuck can be performed as well as to check positional deviation of a pattern written by a pattern writing apparatus not utilizing the electrostatic chuck, by the three-point support.

Embodiment 2

Figure 17:
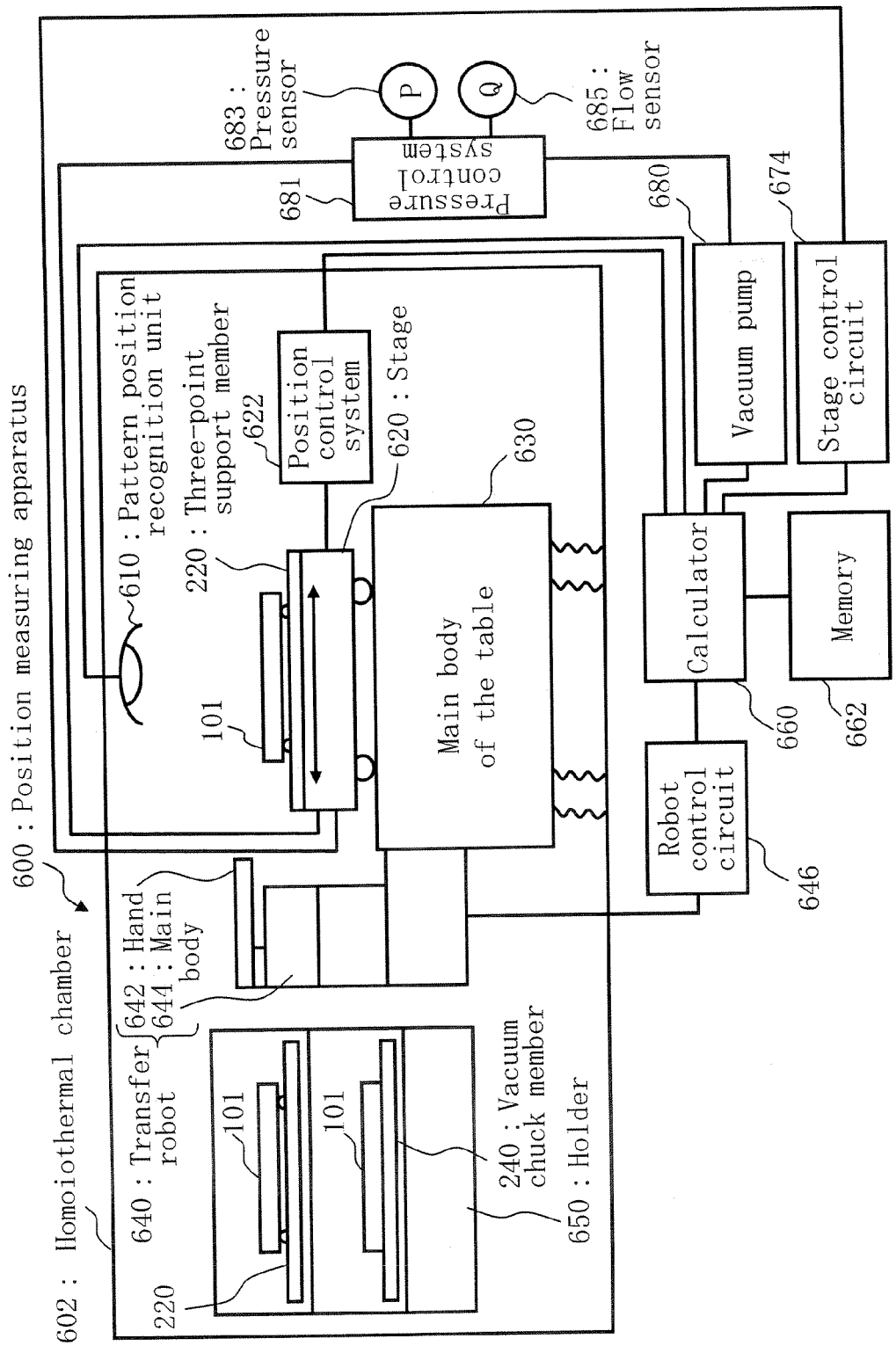
FIG. 17 is a schematic diagram showing a structure of a position measuring apparatus described in Embodiment 2.

FIG. 17 is a schematic diagram showing a structure of a position measuring apparatus described in Embodiment 2. As shown in the figure, the position measuring apparatus 600 includes the homoiothermal chamber 602, the pattern position recognition unit 610, the stage 620, the position control system 622, main body of the table base 630, the transfer robot 640, the holder 650 having storage spaces, the robot control circuit 646, the calculator 660, the memory 662, the vacuum pump 680, the stage control circuit 674, and a pressure control apparatus 681. Except for the respect that the pressure control system 681 is installed in the primary configuration, namely the exhaust-inlet, of the vacuum pump 680 in FIG. 17, the other respects are the same as those in FIG. 1. The pressure control system 681 includes a pressure sensor 683 and a flow sensor 685.

The pressure control system 681, being an example of the control system, controls suction force of the vacuum pump 680. For example, the pressure control system 681 can adjust the vacuum pressure of the vacuum pump 680 by the angle of opening and closing a valve. The pressure sensor 683 measures pressure at the primary side, namely at the vacuum chuck side, of the pressure control apparatus 681. The flow sensor 685 measures volume of air flow exhausted by the vacuum pump 680. By controlling the suction force of the vacuum pump 680 and adjusting chucking force of the backside of a substrate used as the target workpiece 101, deformation of the substrate backside can be controlled. As a result, it is possible to let the substrate backside be closer to an ideal plane.

Embodiment 3

Figure 18:
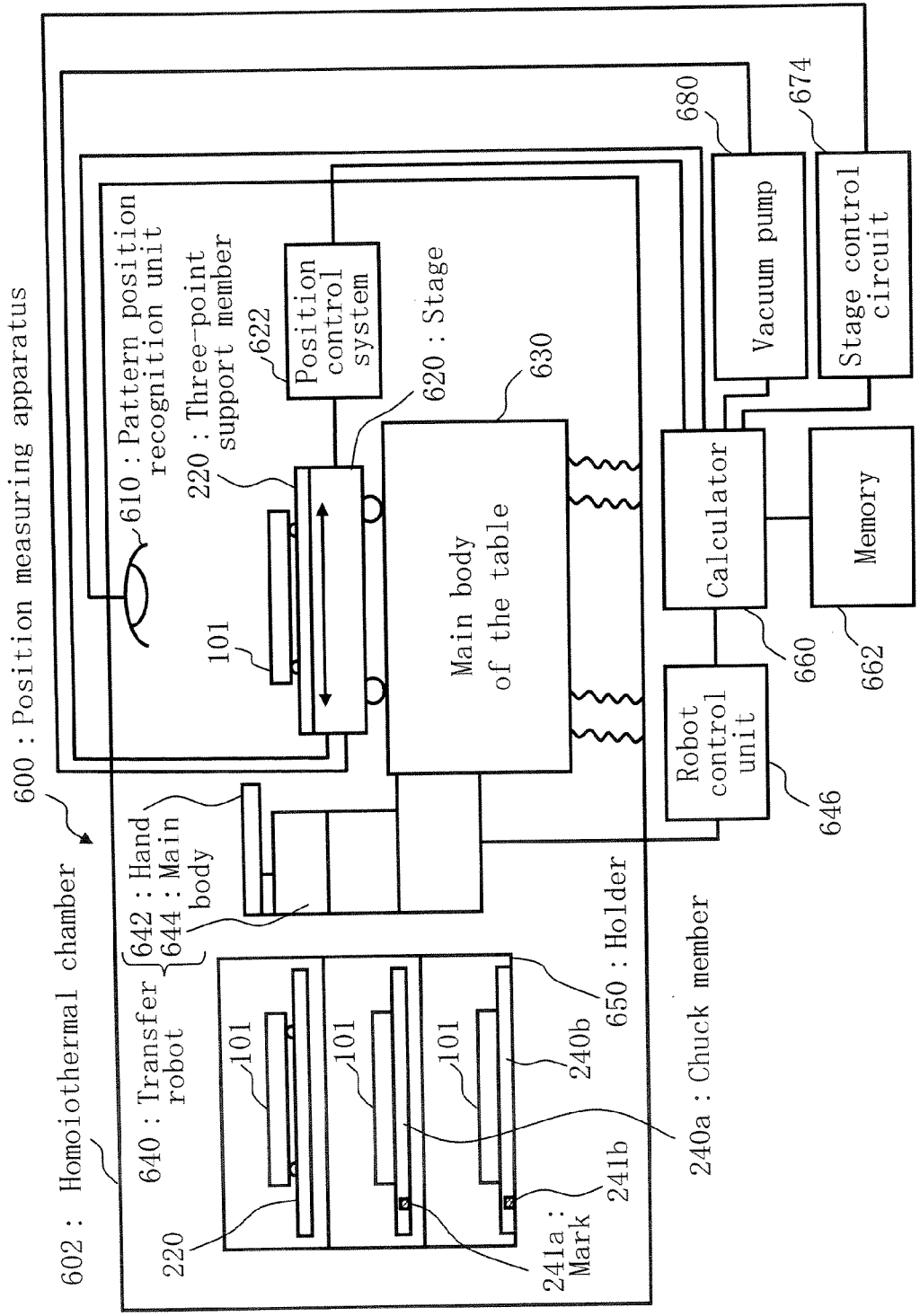
FIG. 18 is a schematic diagram showing a structure of a position measuring apparatus described in Embodiment 3.

FIG. 18 is a schematic diagram showing a structure of a position measuring apparatus described in Embodiment 3. As shown in the figure, the position measuring apparatus 600 includes the homoiothermal chamber 602, the pattern position recognition unit 610, the stage 620, the position control system 622, the main body of the table base 630, the transfer robot 640, the holder 650 having storage spaces, the robot control circuit 646, the calculator 660, the memory 662, the vacuum pump 680, and the stage control circuit 674. Except for the respect that an identification mark 241 is prepared on each vacuum chuck member 240, the other respects are the same as those in FIG. 1.

When storing a plurality of holding members, especially a plurality of vacuum chuck members 240 in the holder 650 serving as storage spaces, the identification mark 241 can identify each vacuum chuck member 240.

Regarding a chuck surface of the electrostatic chuck member used in the exposure apparatus, it is not necessarily formed to be an ideal flat surface. If the target workpiece 101 is held by a chuck on such a chucking surface being not flat of the electrostatic chuck member, the frontside of the substrate used as the target workpiece 101 will be deformed according to the topography of the chucking surface of the electrostatic chuck member. Therefore, when electrostatic chuck members in the holder 650 are used, each vacuum chuck member 240 is manufactured corresponding to the topography of the chuck surface of each electrostatic chuck member respectively. Since the identification mark 241 can identify each vacuum chuck member 240, it is possible to perform a pattern position measurement with the vacuum chuck according to the electrostatic chuck member to be used.

Embodiment 4

The vacuum chuck member 240 in each Embodiment mentioned above has an chucking surface as a flat. Therefore, even if it is tried to remove the substrate being the target workpiece 101, it is difficult to take it off. Then, in Embodiment 4, the structure in which the substrate is easy to remove will be explained.

Figure 19:
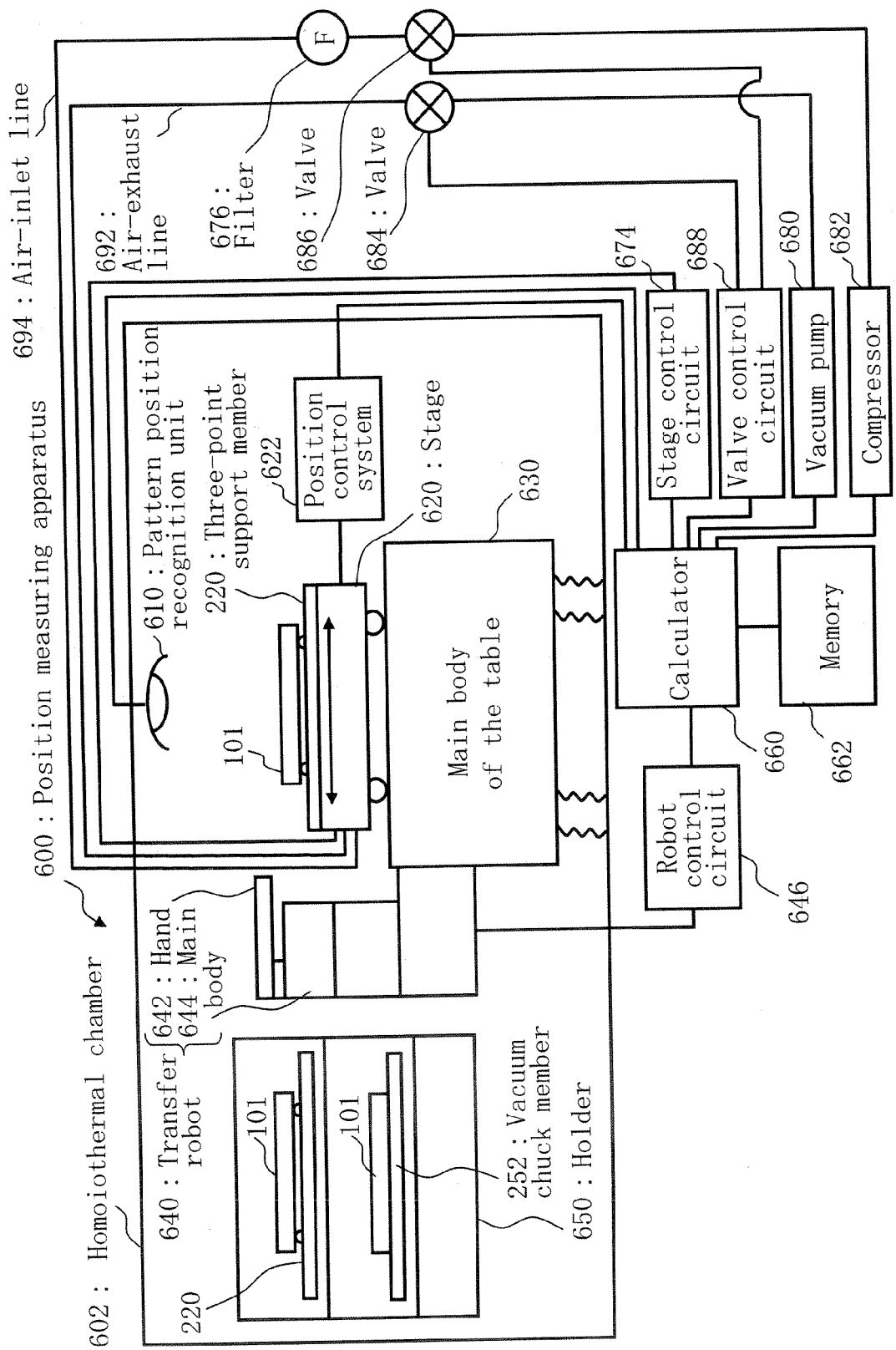
FIG. 19 is a schematic diagram showing a structure of a position measuring apparatus described in Embodiment 4.

FIG. 19 is a schematic diagram showing a structure of the position measuring apparatus in accordance with Embodiment 4. As shown in the figure, the position measuring apparatus 600 further includes a compressor 682 serving as an example of a gas supply part, valves 684, 686, a valve control circuit 688, an air-inlet line 694, and a filter 676, in addition to the structure elements in FIG. 1. Moreover, a vacuum chuck member 252 is stored in the holder 650. Except for the respects that the compressor 682, the valves 684, 686, the valve control circuit 688, the air-inlet line 694, the filter 676 and the vacuum chuck member 252 are provided instead of the vacuum chuck member 240 in FIG. 19, the other respects are the same as those shown in FIG. 1.

In FIG. 19, the valve 684 is arranged in the middle of an air-exhaust line 692 connected to the vacuum pump 680 from the stage 620. On the other hand, the valve 686 is arranged in the middle of the air-inlet line 694 connected to the stage 620 from the compressor 682. The valve 684 opens and closes the air-exhaust line 692. The valve 686 opens and closes the air-inlet line 694. The valves 684 and 686 are controlled by the valve control circuit 688. The filter 676 is arranged in the middle of the air-inlet line 694 connected to the stage 620 from the compressor 682. Although the filter 676 is arranged at the secondary side of the valve 686, it is applicable to arrange at the primary side. Moreover, the control parts of the valve control circuit 688 and the compressor 682 are connected to the calculator 660 to be controlled by it. When the vacuum chuck member 252 is placed on the stage 620, a inner cavity, not illustrated, is formed to be connected from the air-exhaust line 692 to an air-exhaust line of the vacuum chuck member 252. Similarly, when the vacuum chuck member 252 is placed on the stage 620, an inner cavity, not illustrated, is formed to be connected from the air-inlet line 694 to an air-inlet line of the vacuum chuck member 252.

Figure 20:
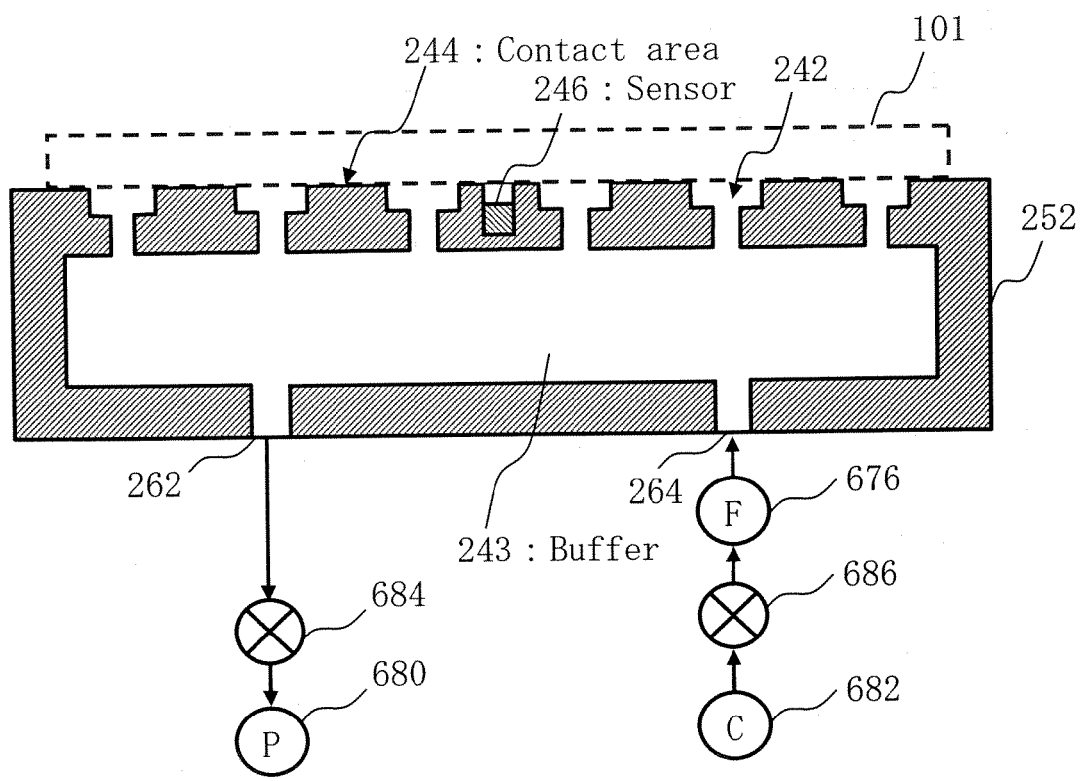
FIG. 20 is a schematic diagram showing an example of a section of a vacuum chuck member described in Embodiment 4.

FIG. 20 is a schematic diagram showing an example of a section of the vacuum chuck member in Embodiment 4. As shown in the figure, the contact area 244 of the vacuum chuck member 252 is formed to have the same shape and area as those of the chucking area 232 of the electrostatic chuck shown in FIG. 4, at a predetermined pitch specified in the SEMI standard. As to the operation of the chuck, the adsorption portion 242 serving as an opening portion is exhausted by the vacuum pump 680 through the air-flow passage 262 being an air-exhaust line via a buffer 243 of a space formed in the vacuum chuck member 252. Although not illustrated herein, in the state of the vacuum chuck member 252 being mounted on the stage 620, the substrate, serving as the target workpiece 101, is chucked by the vacuum pump 680, through the inside of the stage 620 and the vacuum chuck member 252. Thus, the target workpiece 101 is chucked and held to the contact area 244.

Moreover, a flow passage 264 used as the air-inlet line is formed in the buffer 243 in addition to a flow passage 262. The flow passage 264 is connected to the compressor 682 through the filter 676 and the valve 686. Although not illustrated herein, in the state of the vacuum chuck member 252 being mounted on the stage 620, the compressor 682 supplies gas to the substrate being the target workpiece 101 through the inside of the stage 620 and the vacuum chuck member 252. Therefore, based on the structures of FIGS. 19 and 20, it is possible to make the inside of the buffer 243 be in a vacuum state or a pressurization state.

Moreover, even if the inside of the buffer 243, being the partial sealing space mentioned above, becomes a state of negative pressure in a vacuum by the vacuum pump 680 or a state of positive pressure being supplied pure nitrogen ($N_2$) or an air by the compressor 682, it has a structure which can retain a sealed condition as long as there is no gap between the chucking surface and the substrate backside. Particles in the gas can be removed by the filter 676. As mentioned above, as the contact area 244 is a plane with high flatness, even if it is tried to remove the substrate, it is difficult to take it off once after having been completely chucked. Therefore, in the position measuring apparatus 600, when removing the substrate from the vacuum chuck member 252, it is controlled, using gas, such as nitrogen ($N_2$) and air, in order to pressurize the inside of the vacuum chuck member may become higher than the external pressure. Thereby, the substrate can be easily removed.

Moreover, in the position measuring apparatus 600, it is controlled, when the substrate is not held by the vacuum chuck member 252, in order that gas may be leaked to the outside of the buffer 243 (inside the homoiothermal chamber 602 of the apparatus) through the vacuum chuck member 252 by the compressor 682. When a substrate is not placed on the contact area 244 of the vacuum chuck member 252, it is possible to keep the chucking surface of the substrate clean by always letting pure nitrogen or air flow from the chucking portion 242 of the contact area 244. Moreover, when the vacuum chuck member 252, on which no substrate is placed, is arranged on the stage 620 and then, a substrate is placed on the contact area 244 of the vacuum chuck member 252, it is possible to relax the impact at the time of the substrate being placed, by the pressure of the pure nitrogen or air, generated by being always flown.

Moreover, the vacuum chuck member 252 includes a sensor 246, which is a proximity sensor, for detecting a position of the substrate. It is suitable for the sensor 246 to be laid under the center of the chucking surface. An output signal of the sensor 246 is sent to the calculator 660. It becomes possible to detect whether the substrate is in contact with the chucking surface or not by virtue of measuring a gap between the chucking surface and the substrate by using this sensor 246. As to the sensor 246, for example, a sensor of electrostatic capacitance type or an optical sensor which detects a light reflected at the backside surface of the substrate is suitable for this purpose. By using these sensors, it is possible to highly accurately detect the position of a quartz substrate, namely nonmetallic, or a substrate composed of low thermal expansion glass as a main component element. As to the definition whether the chucking surface being in contact with the substrate or not, it is applicable that the gap of 50 nm or less between the chucking surface and the substrate backside, for example, if the flatness of the substrate backside is 50 nm or less, which is requested for an EUV mask.

Whether the substrate is held by the vacuum chuck member 252 or not can be detected based on the output signal of this sensor 246. Moreover, a supply amount and a supply pressure of the gas supplied in the buffer 243 at the time of removing the substrate from the vacuum chuck member 252 may be the same or may be different from a supply amount and a supply pressure of the gas supplied when the substrate is not held by the vacuum chuck member 252.

Embodiment 5

A structure in which a substrate can be held and chucked by a vacuum chuck member at a surface whose flatness is further better than the one described in each Embodiment mentioned above will be explained in Embodiment 5.

Figure 21:
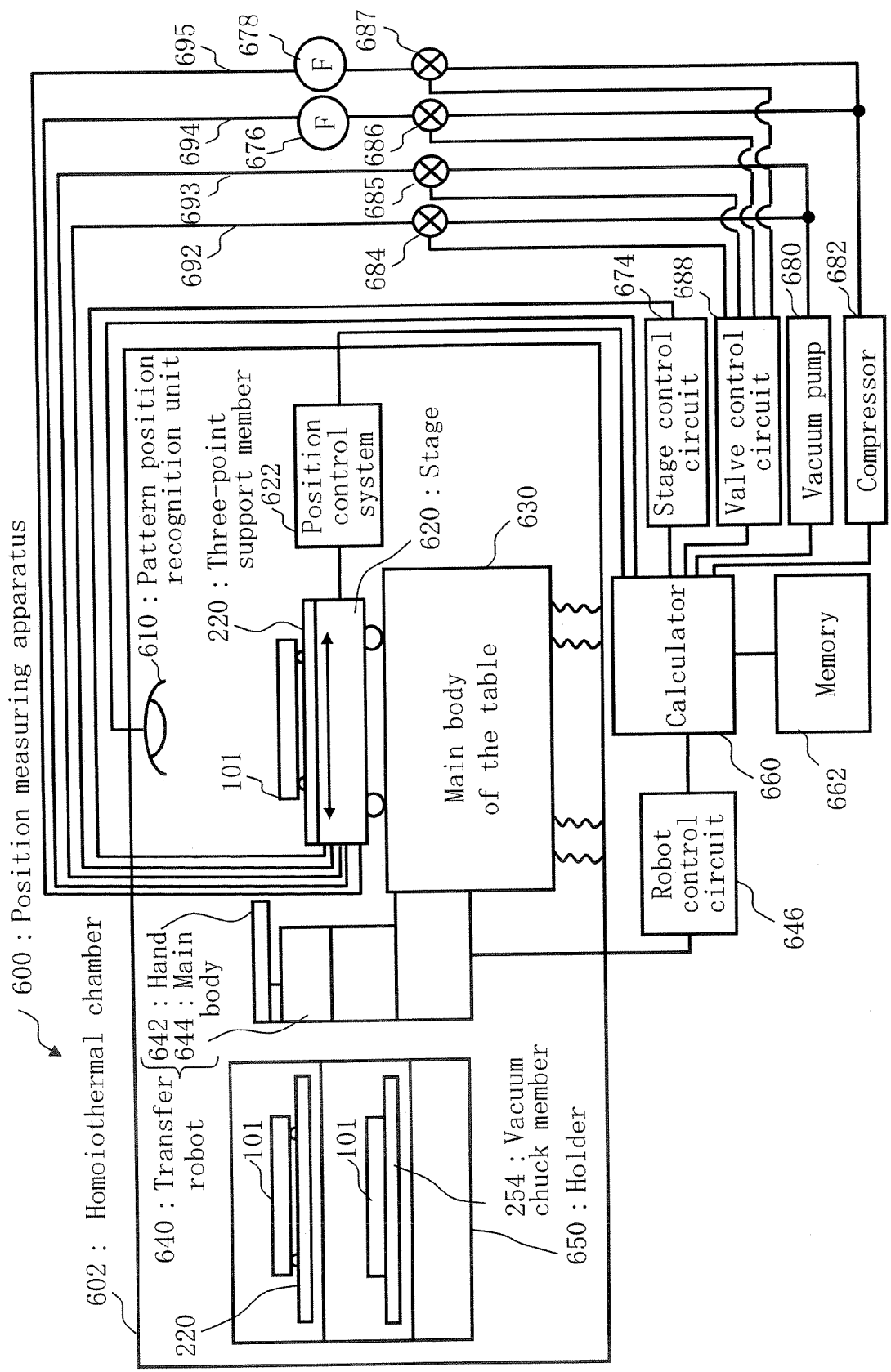
FIG. 21 is a schematic diagram showing a structure of a position measuring apparatus described in Embodiment 5.

FIG. 21 is a schematic diagram showing a structure of the position measuring apparatus in accordance with Embodiment 5. As shown in the figure, the position measuring apparatus 600 further includes valves 685 and 687, an air-inlet line 695, a filter 678, and an air-exhaust line 693, in addition to the structure elements in FIG. 19. Moreover, a vacuum chuck member 254 is stored in the holder 650. Except for the respects that the valves 685 and 687, the air-inlet line 695, the filter 678, and the air-exhaust line 693 are arranged and the vacuum chuck member 254 is provided instead of the vacuum chuck member 252 in FIG. 21, the other respects are the same as those shown in FIG. 19.

In FIG. 21, the valve 685 is arranged in the middle of the air-exhaust line 693 connected to the vacuum pump 680 from the stage 620. Moreover, the air-exhaust lines 692 and 693 are connected finally, to be connected to the vacuum pump 680. On the other hand, the valve 687 is arranged in the middle of the air-inlet line 695 connected to the stage 620 from the compressor 682. The air-inlet lines 694 and 695 are connected to the compressor 682. The valve 685 opens and closes the air-exhaust line 693. The valve 687 opens and closes the air-inlet line 695. The valves 685 and 687 are controlled by the valve control circuit 688 like the valves 684 and 686. The filter 678 is arranged in the middle of the air-inlet line 695 connected to the stage 620 from the compressor 682. Although the filter 678 is arranged at the secondary side of the valve 687, it is applicable to be arranged at the primary side. Impurities in the gas supplied from the compressor 682 can be removed by the filters 676 and 678.

Moreover, when the vacuum chuck member 254 is placed on the stage 620, a first air-passage (not illustrated) for exhaust air is built, which is connected from the air-exhaust line 692 to an air-exhaust line in the vacuum chuck member 254. Furthermore, when the vacuum chuck member 254 is placed on the stage 620, a second air-passage (not illustrated) for exhaust air is built, which is connected from the air-exhaust line 693 to an air-exhaust line in the vacuum chuck member 254. Similarly, when the vacuum chuck member 252 is placed on the stage 620, a first air-passage (not illustrated) for air-intaking is built, which is connected from the air-inlet line 694 to an air-inlet line 694 in the vacuum chuck member 254. Furthermore, when the vacuum chuck member 254 is placed on the stage 620, a second air-passage (not illustrated) for air-intaking is built, which is connected from the air-inlet line 695 to an air-inlet line in the vacuum chuck member 254.

Figure 22:
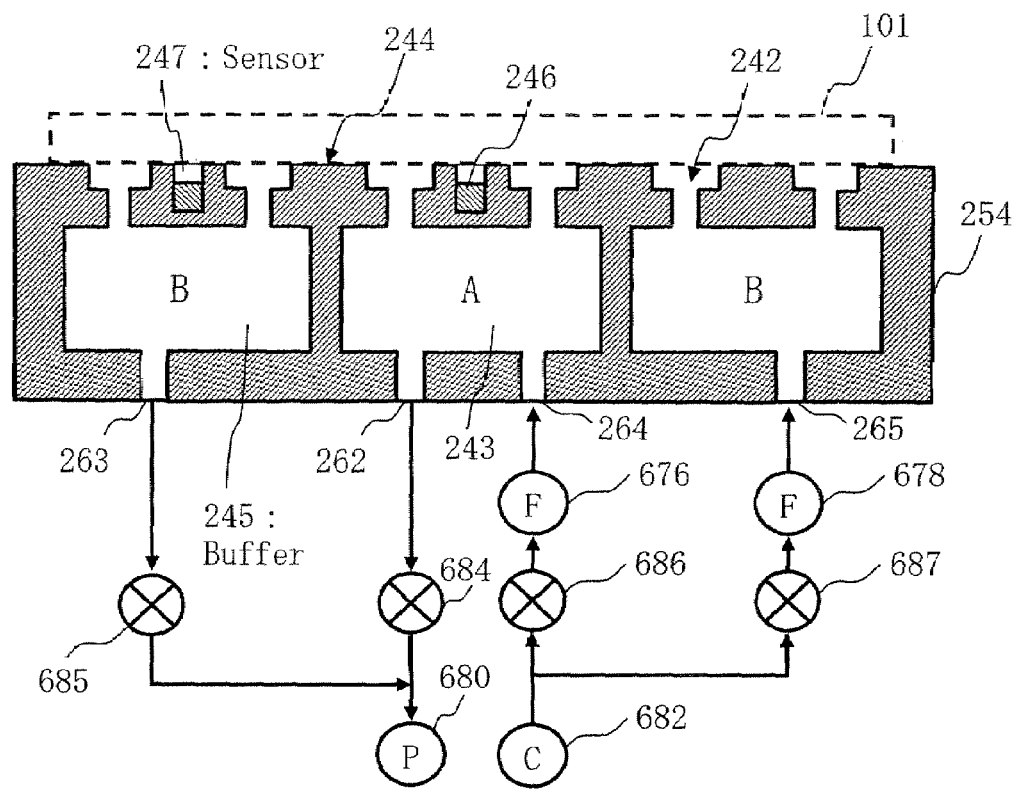
FIG. 22 is a schematic diagram showing an example of a section of a vacuum chuck member described in Embodiment 5.
Figure 23:
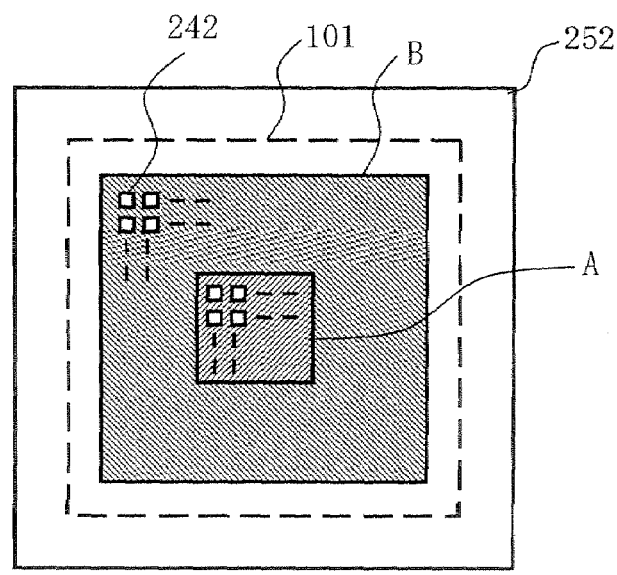
FIG. 23 is a schematic diagram showing an example of an upper surface of a vacuum chuck member described in Embodiment 5.
Figure 24:
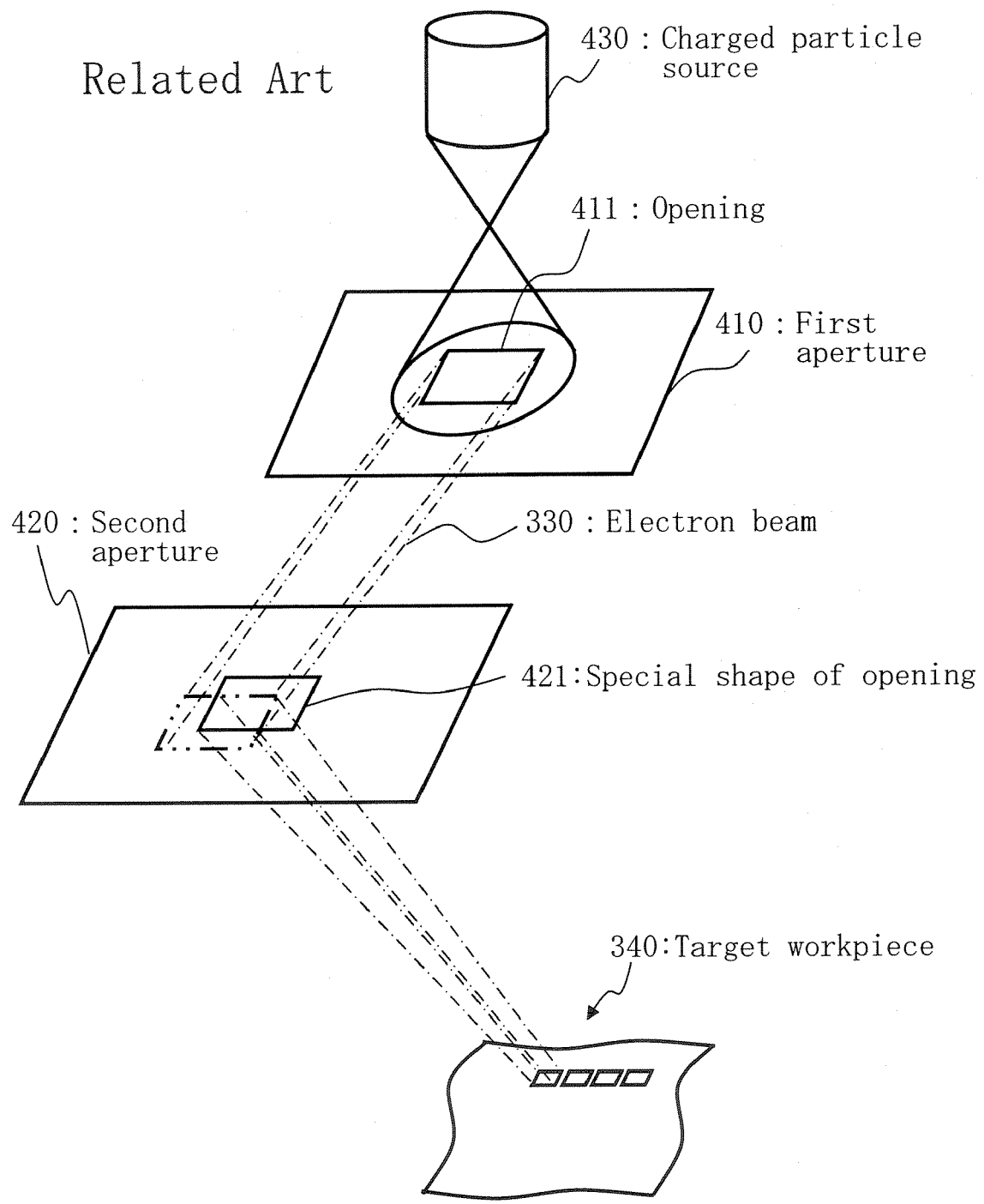
FIG. 24 is a schematic diagram for explaining operations of a conventional variable-shaped electron beam pattern writing apparatus.

FIG. 22 is a schematic diagram showing an example of a section of the vacuum chuck member in Embodiment 5. FIG. 23 is a schematic diagram showing an example of an upper surface of the vacuum chuck member in Embodiment 5.

In FIGS. 22 and 23, the vacuum chuck member 254 divides the sealing space formed inside to be the buffer 243 connected with the adsorption portion 242 formed in the central portion of the contact area 244, and to be a buffer 245 connected with the adsorption portion 242 formed in the circumferential portion. In the buffer 243 denoted by A in FIGS. 22 and 23, the air-flow passages 264 and 262 are provided, and in the buffer 245 denoted by B in FIGS. 22 and 23, flow passages 265 and 263 are provided. The air-exhaust line 692 (not illustrated) is connected to the flow passage 262 through the stage 620. The air-exhaust line 693 (not illustrated) is connected to the flow passage 263 through the stage 620. The air-inlet line 694 (not illustrated) is connected to the flow passage 264 through the stage 620. The air-inlet line 695 (not illustrated) is connected to the flow passage 265 through the stage 620.

Moreover, the vacuum chuck member 254 is provided with the sensor 246 formed under the central portion of the chucking surface, and a sensor 247 formed under the circumferential portion of the chucking surface. Both the sensors 246 and 247 are proximity sensors for detecting the position of the substrate. Similarly to the sensor 246, an output signal of the sensor 247 is sent to the calculator 660. It is possible to detect whether the substrate at the central portion is in contact with the chucking surface or not by measuring the gap between the chucking surface and the substrate backside by using the sensor 246. In addition, it is possible to detect whether the substrate at the circumferential portion is in contact with the chucking surface or not by measuring the distance between the chucking surface and the substrate backside by using the sensor 247. Similar to the sensor 246, it is suitable for the sensor 247, for example, to be a sensor of electrostatic capacitance type or an optical sensor which detects a light reflected at the backside of the substrate. Other respects are the same as those shown in FIG. 20.

As to the operation of the chuck, the substrate serving as the target workpiece 101 is held and chucked by the vacuum pump 680 through a plurality of adsorption portions 242 formed in the central part of the contact area 244, the buffer 243, and the flow passage 262 being an air-exhaust line. In this way, the central part of the target workpiece 101 is held and chucked to the contact area 244. Moreover, the substrate is held and chucked by the vacuum pump 680 through a plurality of adsorption portions 242 formed at the circumference area of the contact area 244, the buffer 245, and the flow passage 263 being an air-exhaust line. In this way, the circumference area of the target workpiece 101 is held and chucked to the contact area 244. Thus, the vacuum chuck member 254 is holding and chucking of the central part of the backside surface in a first and is holding and chucking of the circumference area of the central part in a second, performed during executing the vacuum chuck operation to the backside surface of the substrate.

Moreover, when the vacuum chuck member 254 being mounted on the stage 620, the compressor 682 supplies gas to the target workpiece 101 through the inside of the stage 620 and the buffer 243. Then, the gas is supplied to the central part of the target workpiece 101 from a plurality of the adsorption portions 242 formed at the central part of the contact area 244. Similarly, the compressor 682 supplies gas to the target workpiece 101 through the inside of the stage 620 and the buffer 245. Then, the gas is supplied to the circumference area of the target workpiece 101 from a plurality of the adsorption portions 242 formed at the circumference area of the contact area 244. Therefore, based on the structures of FIGS. 21 to 23, it is possible to make the inside of the buffer 243 and the buffer 245 being in a vacuum state or a pressurization state.

Next, procedures for chucking the substrate and removing it will be explained. When the substrate is not placed on the chucking surface based on the information from the sensors 246 and 247, the valve 686 and the valve 687 are opened in order to leak pure nitrogen or air flow from the adsorption portion 242, through the air-inlet lines 694 and 695 (not illustrated). Thereby, particulate contamination onto the chucking surface can be suppressed. Therefore, the contact area 244 can be kept clean. At this moment, the valves 684 and 685 are closed.

When the sensor 246 or the sensor 247 detects that the substrate is placed on the chucking surface, the valve 686 and the valve 687 are closed firstly. Then, the buffer 243 at the central portion is made to be vacuum through the air-exhaust line 692 (not illustrated) by opening the valve 684. Thereby, it is possible to hold and chuck the central portion of the substrate to the contact area 244. After checking that the central portion has been held and chucked, by the sensor 246, the buffer 245 at the circumferential portion is evacuated through the air-exhaust line 693 (not illustrated) by opening the valve 685. Thereby, it is possible to hold and chuck the circumferential portion of the substrate to the contact area 244. Then, it is checked that the circumferential portion has been held and chucked, by the sensor 247. Thus, when executing the vacuum chuck operation to the backside of the substrate, after chucking the central part of the backside firstly as being mentioned above, the circumference area is chucked secondly as being mentioned above. Accordingly, it has a structure in which the chucking force can be generated at the central portion and at the circumferential portion independently, in Embodiment 5.

As to the substrate chucked herein, it has a convex shape deformed by the internal stress of multilayer film applied on the frontside of the substrate, and therefore there is a gap of about 1 microns or larger between the chucking surface and the substrate backside at the central portion. In order to let the substrate be held and chucked to the chucking surface with having a gap of 50 nm or less, which is a value specified as flatness of the EUV exposure mask, it is necessary to make the central part be held and chucked firstly. This is because, if chucking force is simultaneously generated all over the chucking surface, the circumferential portion, which is in a contacting state, will be held and chucked in advance of the central portion. Then, when the central portion is held and chucked, it is necessary of the chucking force to overcome the friction of the circumferential portion. Therefore, for chucking a surface with high flatness, it is desirable to control to make the central portion being held and chucked firstly.

In order to control to make the central portion being held firstly, it is suitable for the area of this central portion to be as small as possible. However, under the condition that the vacuum pump 680 keeps the same exhaust power, chucking force is proportional to the chucking area. Accordingly, it is desirable for the chucking area to be divided so that the chucking area of the central portion and the chucking area of the circumferential portion may become the same in order to have uniform final adsorption force.

Although the buffer is divided into two in FIGS. 22 and 23: the central portion and the circumferential portion, it is not limited to these two, and dividing into three or more is also applicable. Even when a sealed space is divided into three or more in a vacuum chuck, it is desired to perform dividing so that each chucking surface connected to each sealed space may have the same area respectively, resulting in uniform final adsorption force.

Moreover, it is applicable to have a structure in which chucking force of the first air-suction system is different from that of the second air-suction system when the backside of the substrate is held by the vacuum chuck. For example, chucking force can be different by the unit of chucking area, and in such case, what is necessary is just to adjust the chucking areas of the central portion and the circumferential portion so that the final adsorption force may become uniform.

Moreover, as a result of the chucking operation, if the sensor 246 or the sensor 247 detects that the substrate is not closely attached to the contact area 244 being an chucking surface, it is effective to repeat the procedure of the operations after closing the valves 686 and 687.

Processing contents and operation contents of what is expressed by "circuit" or "process" in the above description can be configured by a computer-executable program. It may be executed by a software program, or alternatively by any combination of software, hardware and/or firmware. When configured by a program, the program is recordable or storable onto a recording medium, such as a magnetic disk drive, magnetic tape drive, FD or ROM (read-only memory).

Moreover, the calculator 450 serving as a computer in FIG. 11 and the calculator 660 serving as a computer in FIGS. 1, 17, 18, 19 and 21 may be connected, via a bus not illustrated, to a RAM (Random Access Memory), a ROM, and a magnetic disk (HD) drive serving as an example of a storage device, a keyboard (K/B) and a mouse serving as an example of an input means, a monitor and a printer serving as an example of an output means, an external interface (I/F), ED, DVD, CD serving as an example of an input/output means, etc.

Referring to concrete examples, Embodiments have been described in the above. However, the present invention is not limited to these examples.

Moreover, although description of apparatus components, control methods, etc. not directly required in explaining the present invention is omitted, it is possible to suitably select and use some or all of them when necessary. For example, while configuration of a control unit for controlling the variable-shaped EB writing apparatus 100 is not described in detail, it should be understood that needed control unit configuration can be suitably selected and used.

In addition, any other writing method of charged particle beams, writing apparatus of charged particle beams, measuring method of a positional deviation, and position measuring apparatus which include elements of the present invention and which are design-modifiable by those skilled in the art are incorporated within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A position measuring apparatus comprising:
   a holder having storage spaces in which both a first set composed of a three-point support member for supporting a backside of a first substrate being itself a mask for lithography at three points and the first substrate supported on the three-point support member, and a second set composed of a vacuum chuck member for holding a backside of a second substrate being itself a mask for lithography and the second substrate held by the vacuum chuck member are prepared;
   a stage on which one of the first set and the second set selectively loaded from the storage spaces of the holder is mounted;
   a vacuum pump to hold and chuck the second substrate through the vacuum chuck member in a state of being mounted on the stage; and
   a recognition unit to recognize a position of a pattern written on the first substrate supported by the three-point support member mounted on the stage and a position of a pattern written on the second substrate held by the vacuum chuck member on the stage.

2. The position measuring apparatus according to claim 1, wherein, when the first and second substrates are used for exposing EUV (Extreme Ultra-Violet) light in an exposing apparatus as an EUV mask, the first and second substrates are held by an electrostatic chuck member having a chucking surface with an area and a shape in the exposing apparatus, and the vacuum chuck member whose chucking backside surface of the second substrate is formed to have an area and a shape in accordance with the area and the shape of the chucking surface of the electrostatic chuck member is prepared in the storage spaces of the holder.

3. The position measuring apparatus according to claim 2, wherein the vacuum chuck member is composed of a material having stiffness harder than stiffness of a material itself used for the electrostatic chuck member.

4. The position measuring apparatus according to claim 1, further comprising a control unit to control a suction force obtained by the vacuum pump.

5. The position measuring apparatus according to claim 1, further comprising a gas supply unit to supply gas through the vacuum chuck member.

6. The position measuring apparatus according to claim 5, wherein the position measuring apparatus controls pressure of a chucking surface of the vacuum chuck member to be higher than an external pressure by using the gas, when removing the second substrate from the vacuum chuck member.

7. The position measuring apparatus according to claim 5, wherein, in a state of the second substrate not being placed on the vacuum chuck member, the position measuring apparatus controls the gas leaking through the vacuum chuck member.

8. The position measuring apparatus according to claim 1, wherein the vacuum chuck member includes a sensor to detect a position of the backside surface of the second substrate.

9. The position measuring apparatus according to claim 8, wherein the sensor is one of an electrostatic capacitance sensor and an optical sensor.

10. The position measuring apparatus according to claim 1, wherein the vacuum chuck member, when holding the backside of the second substrate by the vacuum chuck member, includes a chucking system for holding a central part of the backside firstly and a chucking system for holding a circumference area of the central part secondly.

11. The position measuring apparatus according to claim 10, wherein the primary chucking system and the secondary chucking system have different suction forces when holding the backside surface of the second substrate by the vacuum chuck member.

12. The position measuring apparatus according to claim 10, wherein the secondary chucking system adsorbs the circumference area after the primary chucking system adsorbs the central part of the backside when holding the backside of the second substrate by the vacuum chuck member.

13. The position measuring apparatus according to claim 12, wherein the vacuum chuck member includes a sensor to detect that the central part of the backside is adsorbed and attached to the chucking surface of the vacuum chuck member.

14. The position measuring apparatus according to claim 1, wherein a plurality of the vacuum chuck members are prepared in the storage spaces of the holder, and each of the plurality of vacuum chuck members has an identification mark.

15. A positional deviation measuring method comprising:
measuring a first positional deviation of a pattern written on a first EUV mask being held by a vacuum chuck member mounted on a stage as a second positional deviation of a pattern printed onto a wafer using the first EUV mask, with selectively using the vacuum chuck member which is prepared in a position measuring apparatus, the vacuum chuck member and a three-point support member being prepared in the position measuring apparatus; and measuring a third positional deviation of a pattern written on a second mask being supported by the three-point support member mounted on the stage as a fourth positional deviation of the pattern on the second mask caused by conditions of a pattern writing apparatus which writes the second mask, with selectively using the three-point support member which is prepared in the position measuring apparatus.

16. The positional deviation measuring method according to claim 15, wherein the vacuum chuck member has a chucking surface whose area and shape are formed to be in accordance with an area and a shape of a chucking surface of a standardized electrostatic chuck member.

17. The positional deviation measuring method according to claim 15, wherein the vacuum chuck member is composed of a material having stiffness harder than stiffness of a low thermal expansion material itself used for an electrostatic chuck member.

18. A positional deviation measuring method comprising:
measuring, in a state of a backside of a substrate being held by a vacuum chuck, a positional deviation of a primary pattern that is written after correcting a predicted positional deviation of a pattern written on a front-side surface of the substrate, in the case of the backside surface of the substrate being corrected to be flat by measurement data of the backside topography of the substrate without influence of gravity sag; and measuring, in a state of the backside of the substrate being supported at three points, a positional deviation of a secondary pattern that is written after correcting a predicted positional deviation of a pattern written on the front-side surface of the substrate, in the case of the backside surface of the substrate being not corrected to be flat.

19. The positional deviation measuring method according to claim 18, wherein the vacuum chuck member has a chucking surface whose area and shape are formed to be in accordance with an area and a shape of a chucking surface of a standardized electrostatic chuck member.

20. The positional deviation measuring method according to claim 19, wherein the vacuum chuck member is composed of a material having stiffness harder than stiffness of a low thermal expansion material itself used for an electrostatic chuck member.

* * * * *